(12) United States Patent
Kawachi et al.

(10) Patent No.: US 7,492,361 B2
(45) Date of Patent: Feb. 17, 2009

(54) IMAGE DISPLAY APPARATUS USING THIN-FILM TRANSISTORS

(75) Inventors: Genshiro Kawachi, Yokohama (JP);
Hiroyuki Abe, Yokohama (JP);
Kunihiro Asada, Yokohama (JP);
Makoto Ikeda, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 577 days.

(21) Appl. No.: 11/045,391

(22) Filed: Jan. 31, 2005

(65) Prior Publication Data
US 2005/0206603 A1    Sep. 22, 2005

(30) Foreign Application Priority Data
Mar. 19, 2004  (JP)  ............................. 2004-081310
Dec. 17, 2004  (JP)  ............................. 2004-366598

(51) Int. Cl.
*G09G 5/00*    (2006.01)
(52) U.S. Cl. .................... 345/204; 315/206; 315/80; 315/168.3; 315/169.4
(58) Field of Classification Search ................ 345/204, 345/206, 80; 315/169.3–169.4
See application file for complete search history.

(56) References Cited
U.S. PATENT DOCUMENTS
7,071,629 B2 * 7/2006 Russ et al. ............... 315/169.3

2004/0233374 A1 * 11/2004 Yamazaki et al. ........... 349/153
2005/0110103 A1 *  5/2005 Setlak ........................ 257/414

FOREIGN PATENT DOCUMENTS
CN        1353448 A      6/2002
JP        11-281996      10/1999
JP        2002-176350    6/2002

OTHER PUBLICATIONS
Takaya Ogawa, "The Optimum Design of Moving Image Display System with TFT Circuits on Glass Substrate", Feb. 13, 2004, (Committee for Examining Theses Presented for Master's Degree in Electrical Engineering, Engineering Department, Graduated School of Tokyo University).

* cited by examiner

*Primary Examiner*—Richard Hjerpe
*Assistant Examiner*—Leonid Shapiro
(74) *Attorney, Agent, or Firm*—Oblon, Spivak, McClelland, Maier & Neustadt, P.C.

(57) ABSTRACT

There are provided a display apparatus and a display method, with which compressed image data that is to be decompressed can be transmitted to the display apparatus in an environment in which a transmission capacity is not always secured, and good image display is realized. An example of the display apparatus is an active matrix display apparatus formed by using thin-film transistors formed on an insulating substrate. In the active matrix display apparatus, a circuit that receives an image data signal from an external system via a non-contact transmission path and amplifies the image data signal, a circuit that processes the image data signal, and a memory circuit that stores the processed image data are integrated on the insulating substrate.

14 Claims, 23 Drawing Sheets

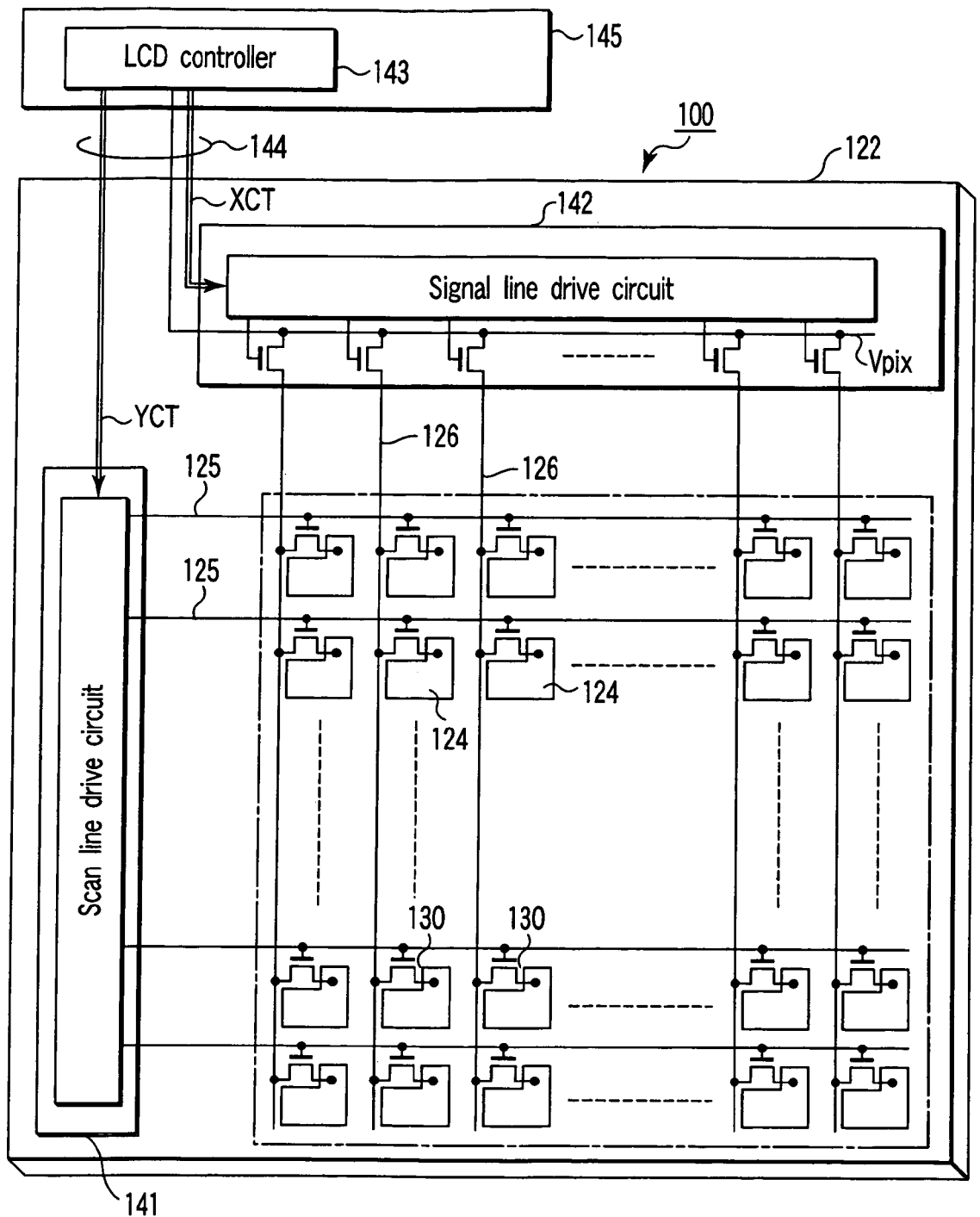
F I G. 1

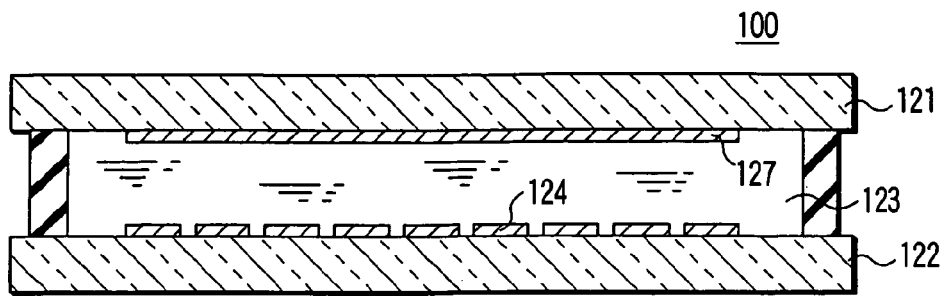
F I G. 2
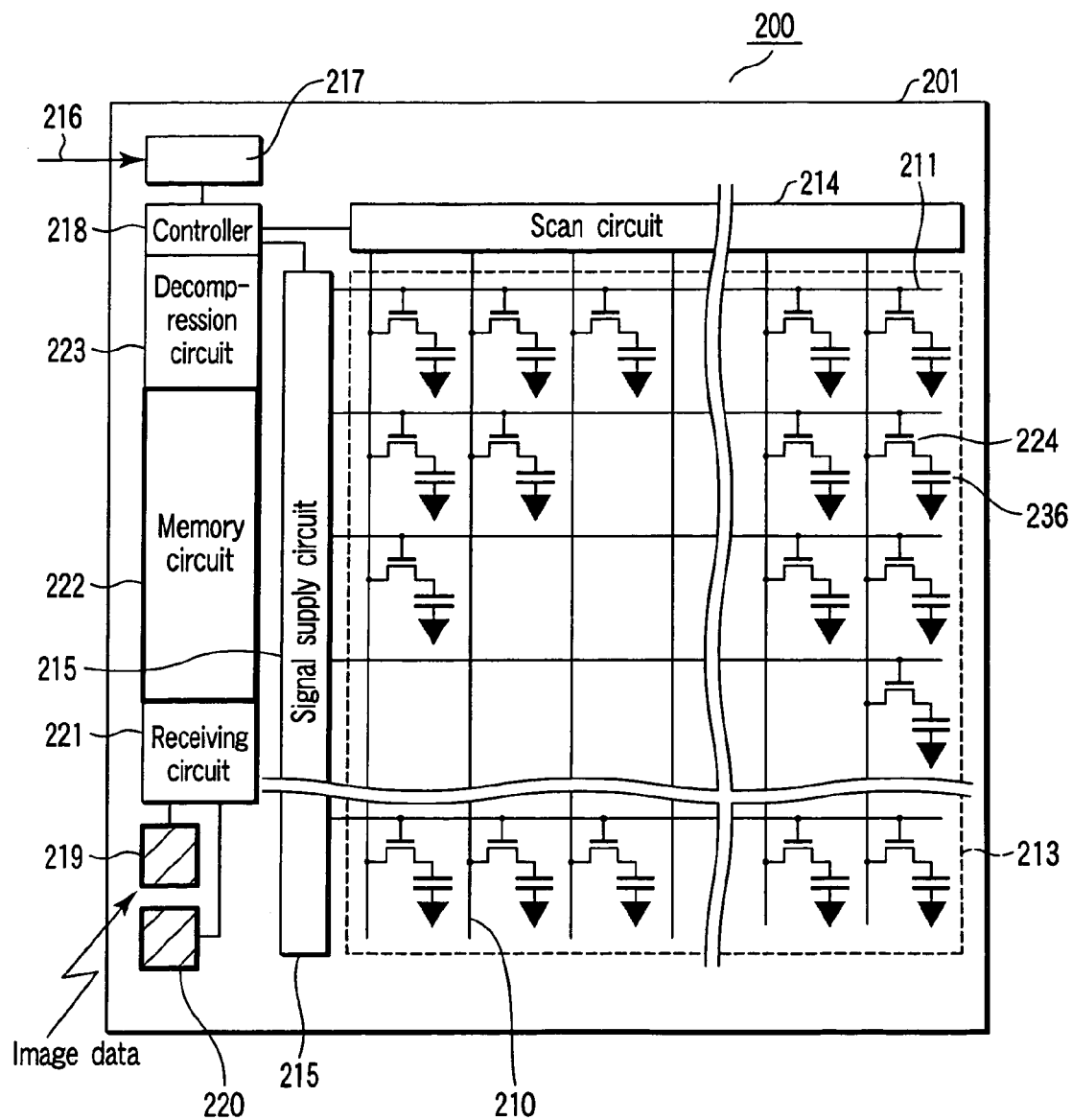
F I G. 3

320e : Phase 0
320f : Phase π/2
320g : Phase π
320h : Phase 3π/2

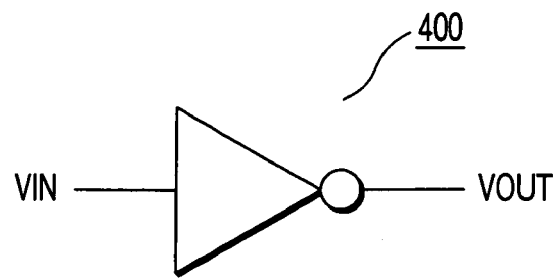
F I G. 21
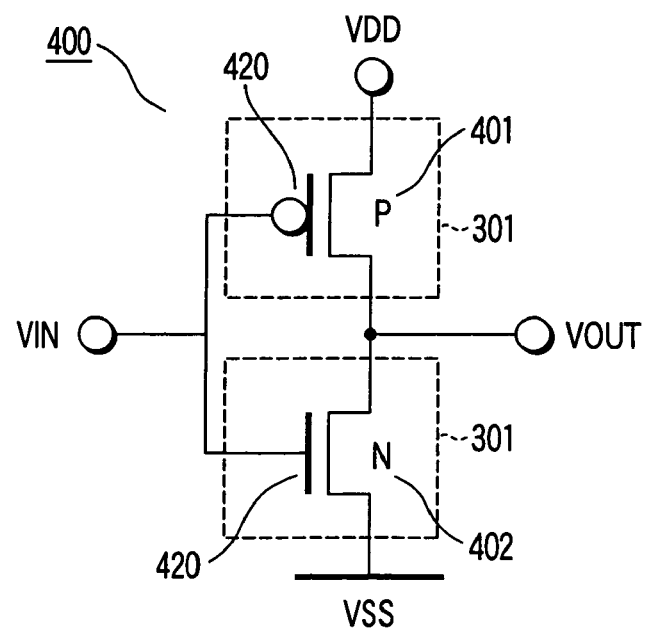
F I G. 22

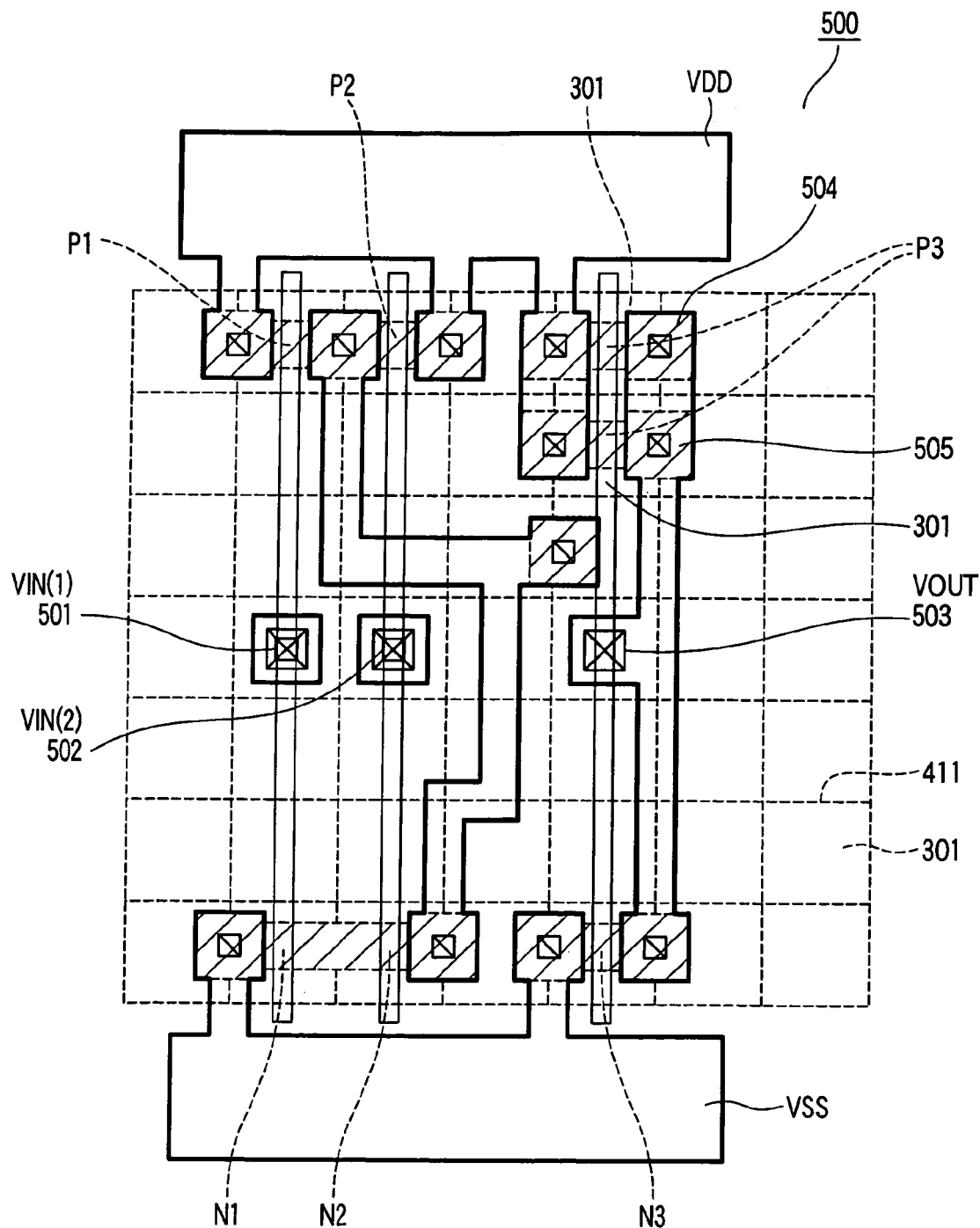
F I G. 24

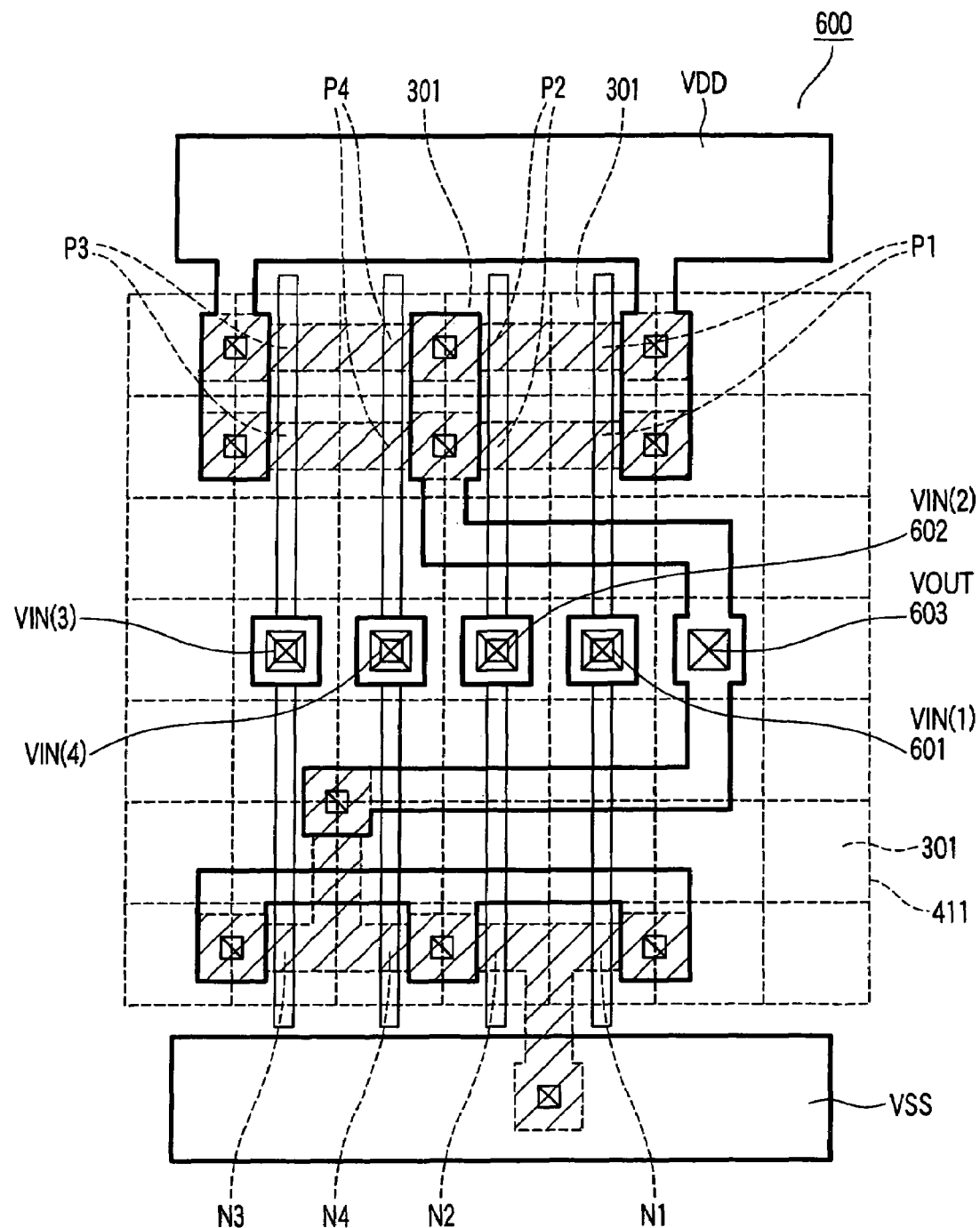
F I G. 27

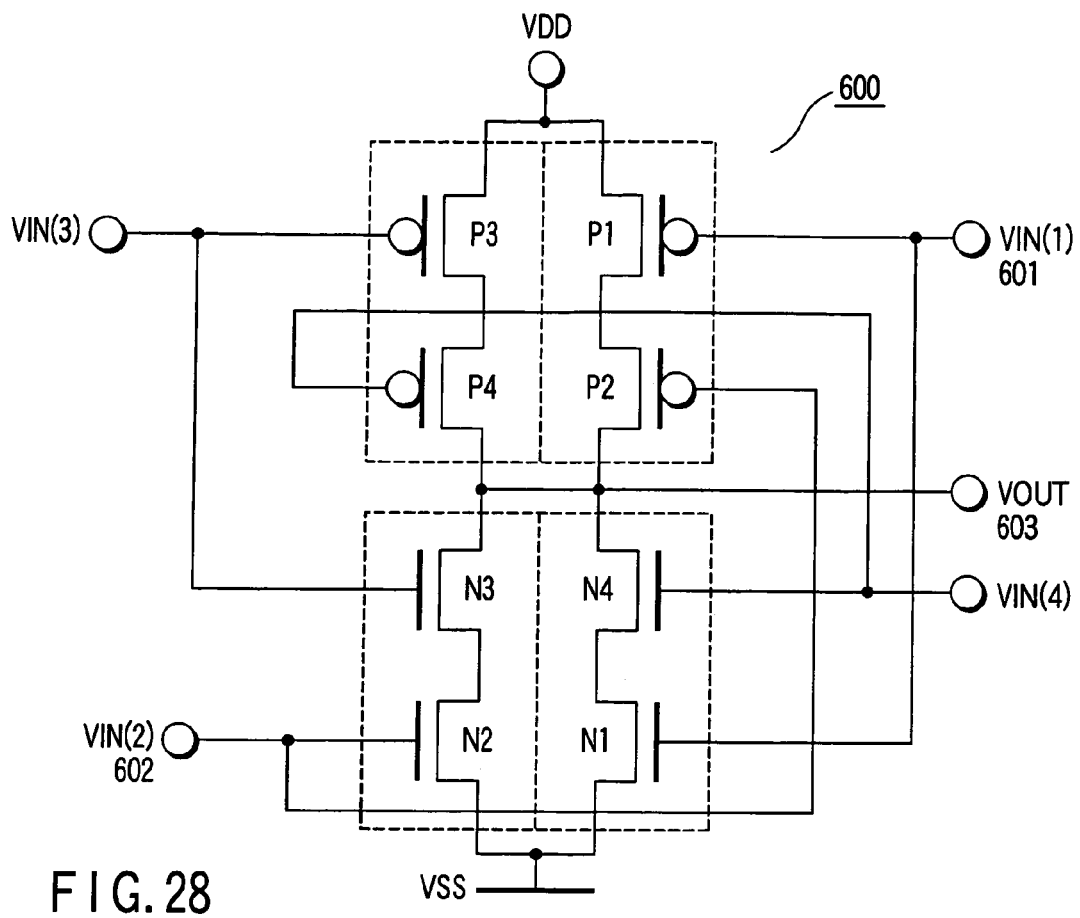
F I G. 28
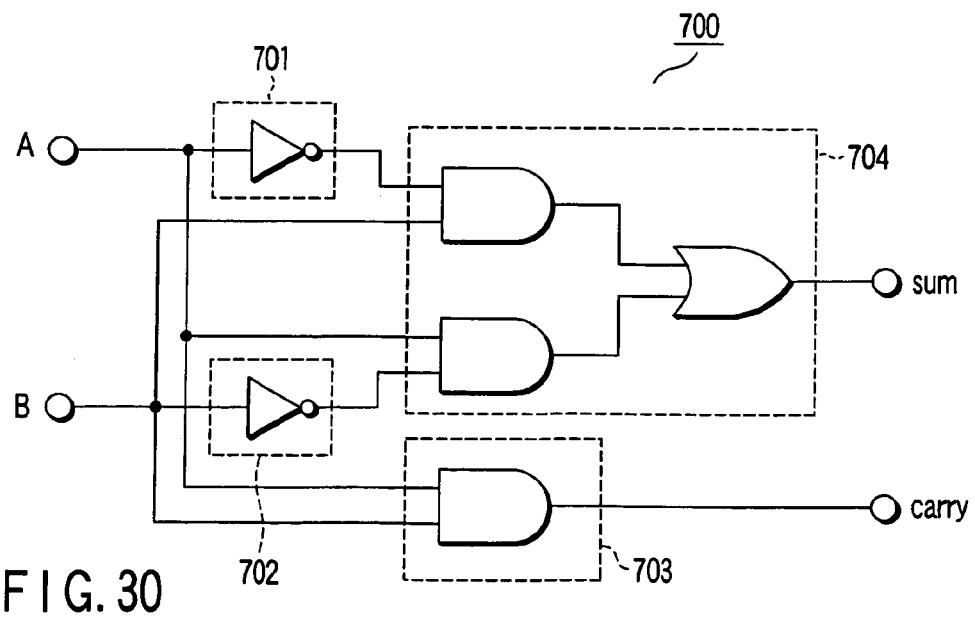
F I G. 30

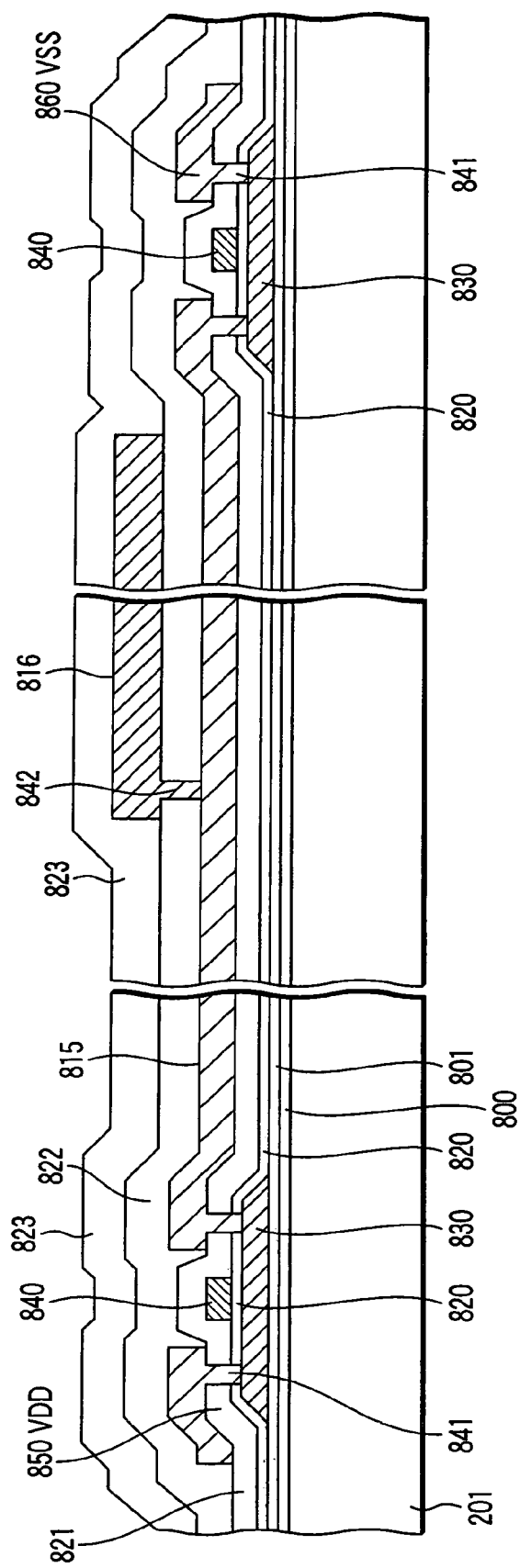
F I G. 31

IMAGE DISPLAY APPARATUS USING THIN-FILM TRANSISTORS

CROSS-REFERENCE TO RELATED APPLICATIONS

This application is based upon and claims the benefit of priority from prior Japanese Patent Applications No. 2004-081310, filed Mar. 19, 2004; and No. 2004-366598, filed Dec. 17, 2004, the entire contents of both of which are incorporated herein by reference.

BACKGROUND OF THE INVENTION

1. Field of the Invention

The present invention relates to a structure of a display apparatus using thin-film transistors that are formed by making use of a crystalline semiconductor thin film that is formed on an insulating substrate.

2. Description of the Related Art

An active-matrix flat-panel display using thin-film transistors is known as a display apparatus for OA equipment, etc., which displays image information and character information. In recent years, with a development of multi-media communication technology, a function-integrated display that is called "system-on-panel" has attracted attention as a next-generation display. This new type of display has a small size and light weight for personal use, and has high resolution and high image quality. In addition, peripheral functional components, such as driver circuits, a memory circuit, a DA converter circuit and an image processing circuit, which relate to image display, are integrated on the display panel.

This display apparatus for use in personal computers, etc., however, adopts a display scheme wherein an image signal, which is obtained by decompressing compressed data, is received and displayed. To be more specific, a system apparatus such as a personal computer, which is constructed separately from the display panel, decompresses compressed data that relates to an image to be displayed, thereby generating bitmap data. The bitmap data is stored in a video memory within the system apparatus. The bitmap data corresponding to each display bit, which is stored in the video memory, is successively transmitted from an LCD (liquid crystal display) controller within the system apparatus to the display apparatus. On the display apparatus side, the transmitted data is latched on a line-by-line basis, and the data is output from a data driver circuit. Thus, an image is displayed on a line-by-line basis.

FIG. 1 shows an example of a liquid crystal display apparatus, and FIG. 2 is a cross-sectional view thereof. A display apparatus 100 includes a pair of transparent substrates 121 and 122 formed of, e.g. glass plates, a liquid crystal layer 123, a plurality of pixel electrodes 124, scan lines 125, signal lines 126, a counter-electrode 127, and a plurality of thin-film transistors 130. As is shown in the cross-sectional view of FIG. 2, the liquid crystal layer 123 is disposed between the paired transparent substrates 121 and 122. The plural pixel electrodes 124, which are disposed in a matrix in row and column directions, and the plural thin-film transistors 130, which are connected to the associated pixel electrodes 124, are provided on one of the transparent substrates, 122. Each pixel electrode 124 and each thin-film transistor 130 are connected to the associated scan line 125 and signal line 126. Each scan line 125 is connected to a scan line drive circuit 141, and each signal line 126 is connected to a signal line drive circuit 142. The scan line drive circuit 141 and signal line drive circuit 142, which are formed on the substrate 122, are connected to the LCD controller 143 within the system apparatus 145, which is connected to the display apparatus 100 via a transmission line 144 that is formed of a signal cable. The scan line drive circuit 141 receives a vertical scan control signal YCT from the LCD controller 143, and the signal line drive circuit 142 receives a pixel video signal Vpix as bitmap data, and a vertical scan control signal XCT from the LCD controller 143.

In the above-described structure, if the definition and the number of colors of an image to be displayed increase, the amount of transmission data, such as pixel video signals Vpix, increase accordingly. On the other hand, since the refresh rate for image display is constant, the clock frequency of the transmission line 144, which is formed of the signal cable, needs to be increased in accordance with the increase in amount of data. If the frequency of the transmission line 144 increases, there arises such a problem that undesirable electromagnetic radiation occurs from the transmission line and noise is produced in the external apparatus due to electromagnetic interference (EMI). To solve this problem, a technique of reducing EMI by differential driving with low voltage, which is known as LVDS (Low Voltage Differential Signaling), has been adopted. An example of this technique is disclosed in Jpn. Pat. Appln. KOKAI Publication No. 2002-176350.

In the above-described structure wherein the display apparatus 100 and the LCD controller 143 that is provided in the system apparatus 145 are connected via the transmission line 144 that is composed of the signal cable, special consideration needs to be paid to the design of the transmission line in order to reduce EMI from the transmission line. In a desktop computer, for instance, the LCD controller 143 and display apparatus 100 need to be connected by a dedicated shield cable that is designed to prevent unnecessary radiation. In a notebook computer, the display apparatus 100 and LCD controller 143 are disposed in a single casing and they are connected by a short flexible cable. That is, in this technique, it is necessary that the transmission line between the LCD controller 143 and display apparatus 100 be designed to have a data transmission rate enough to transmit image data that is to be displayed. Hence, in order to display an image on the display apparatus 100, there is no choice but to dispose the LCD controller 143 near the display apparatus 100. It is thus difficult to use the computer in such a way that the lightweight display apparatus alone is moved and made to display an image at a place where image display needs to be performed.

This type of display apparatus, however, is not adaptable to such a future ubiquitous computing environment that computers are used anywhere, anytime. The anywhere, anytime use means that the transmission line with a sufficient performance is not always secured.

As stated above, there is such a problem that the display apparatus 100 that requires a very high clock frequency for transmitting bitmap data is not easily adaptable to the environment, such as a wireless transmission system, where a sufficient transmission capacity is not always secured.

An object of the present invention is to provide a display apparatus wherein, for example, compressed image information, which is to be decompressed subsequently, can be transmitted to the display apparatus in such an environment where a sufficient transmission capacity is not always secured, and good image display is enabled.

Another object of the present invention is to provide a structure of a thin-film transistor for realizing a display apparatus that meets the above demand at low cost.

BRIEF SUMMARY OF THE INVENTION

In order to achieve the above objects, the embodiments of the present invention provide, for example, the following apparatuses and methods.

For example, there is provided an active matrix display apparatus formed by using thin-film transistors formed on an insulating substrate, comprising: a circuit that receives an image data signal from an external system via a non-contact transmission path, and amplifies the image data signal; a circuit that processes the image data signal; and a memory circuit that stores the processed image data, wherein the respective circuits are integrated on the insulating substrate.

There is also provided a display apparatus formed by using thin-film transistors formed on an insulating substrate, comprising: a circuit that receives an image data signal from an external system via a non-contact transmission path, and amplifies the image data signal; a circuit that processes the image data signal; and a memory circuit that stores the processed image data, wherein the respective circuits are integrated on the insulating substrate, and at least one of the respective circuits is formed by thin-film transistors formed on the insulating substrate.

There is also provided a display apparatus formed by using thin-film transistors formed on an insulating substrate, comprising: a circuit that receives an image data signal from an external system via a non-contact transmission path, and amplifies the image data signal; a circuit that processes the image data signal; and a memory circuit that stores decompression-processed image data, wherein the respective circuits are integrated on the insulating substrate, at least one of the respective circuits is formed by thin-film transistors formed on the insulating substrate, and at least one of the thin-film transistors is formed on a semiconductor island that includes a re-crystallized single-crystal region and a poly-crystalline region that adjoins the single-crystal region. A channel of the thin-film transistor is formed in the re-crystallized single-crystal region.

There is also provided an image display method that effects image display using a display apparatus that includes a receiving circuit, a compressed data decompression circuit, a memory circuit and an active matrix display unit, which are formed using thin-film transistors formed on an insulating substrate, comprising: a step of causing the receiving circuit to receive a compressed image data signal from an external system via a non-contact transmission path, and to amplify the image data signal; a step of decompressing the amplified image data signal into bitmap data corresponding to each of display bits; a step of storing the decompression-processed image data in the memory circuit; and a step of reading out the bitmap data from the memory circuit and causing the active matrix display unit to display the bitmap data. Each of the thin-film transistors is formed on a semiconductor island that includes a re-crystallized single-crystal region and a poly-crystalline region that adjoins the single-crystal region.

According to the embodiments of the present invention, it is possible to realize a flat display at low cost, which can effect high-quality image display even in a mobile environment in which a sufficient transmission capacity is not always secured.

BRIEF DESCRIPTION OF THE SEVERAL VIEWS OF THE DRAWING

The features and objects of the present invention, as well as the methods of implementing the invention, will be clear, and will be well understood, from the description given below of specific embodiments and the accompanying drawings.

FIG. 1 shows an example of the structure of an active matrix display apparatus;

FIG. 2 is a cross-sectional view of the active matrix display apparatus;

FIG. 3 shows the structure of an active matrix display apparatus according to a first embodiment of the present invention;

FIG. 21 is a logic diagram of the inverter circuit cell according to the embodiments of the invention;

FIG. 22 is a circuit diagram of the inverter circuit cell according to the embodiments of the invention;

FIG. 24 is a plan view of an AND circuit cell according to the embodiments of the invention;

FIG. 27 is a plan view of an XOR circuit cell according to the embodiments of the invention;

FIG. 28 is a circuit diagram of the XOR circuit cell according to the embodiments of the invention;

FIG. 30 is a circuit diagram of the half adder according to the embodiments of the invention; and FIG. 31 is a cross-sectional view of the adder circuit, taken along line X-X' in FIG. 29.

DETAILED DESCRIPTION OF THE INVENTION

Figure 4:
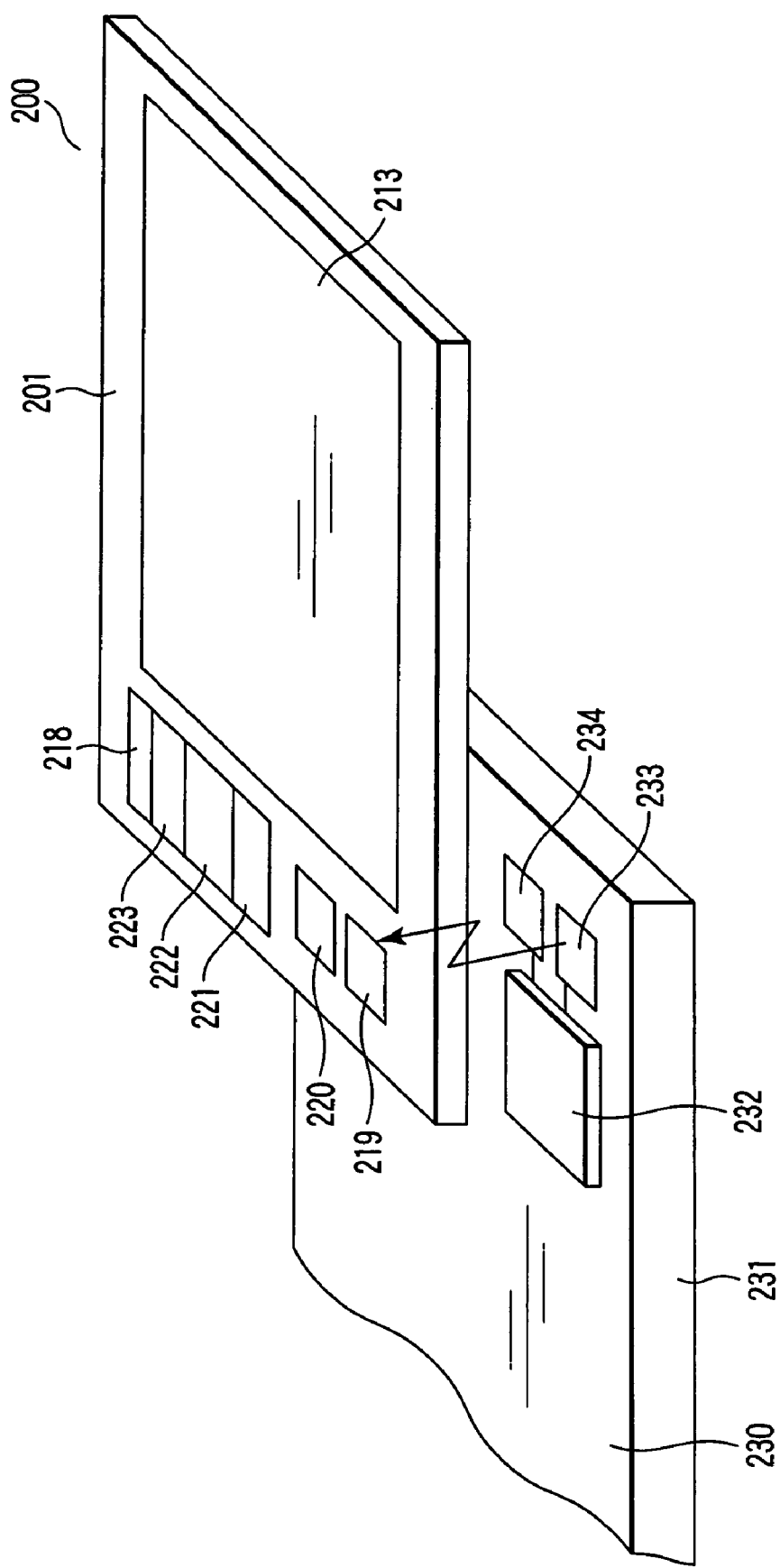
FIG. 4 is a perspective view that illustrates a scheme of data transmission between a display substrate and a system substrate in the first embodiment of the invention.

Embodiments of the present invention will now be described with reference to the accompanying drawings.

First Embodiment

FIG. 3 shows a display substrate 200 of a display apparatus according to a first embodiment of the present invention. This display apparatus is a so-called active matrix display apparatus. A glass substrate 201 in FIG. 3 corresponds to the transparent substrate 122 in FIG. 1. The glass substrate 201 is an improvement of the transparent substrate 122.

A plurality of scan lines 210 and a plurality of video signal lines 211 are arranged in a matrix on the insulating substrate 201, for example, a transparent no-alkali glass substrate 201. The substrate 201 is not limited to the glass substrate, and may be a quartz substrate or a plastic substrate. A thin-film transistor active matrix region 213 is formed such that a plurality of thin-film transistors (TFTs) 224 are disposed in rectangular pixel regions that are defined by the lines 210 and 211. A scan circuit 214 and a signal supply circuit 215, which are formed using thin-film transistors, are disposed in order to drive the thin-film transistors 224 in the respective pixel regions.

A DC/DC converter circuit 217 and a timing control circuit 218, which are also formed using thin-film transistors, are integrated on the glass substrate 201. The DC/DC converter circuit 217 converts a power supply voltage 216 from outside and supplies necessary voltages to the drive circuits 214 and 215. The timing control circuit 218 receives video data, control signals, etc., executes necessary processing, and supplies timing signals to the scan circuit 214 and signal supply circuit 215.

Two electrodes 219 and 220, which serve as elements for receiving compressed image data from outside, are formed on a region on the glass substrate 201, which is outside the active matrix region 213. The two electrodes 219 and 220 are connected to a receiving circuit 221. A memory circuit 222 is provided adjacent to the receiving circuit 221. The memory circuit 222 temporarily stores compressed image data, which is received and amplified by the receiving circuit 221, so that the stored compressed image data may be used in a data decompression process. The memory circuit 222 may be composed of, e.g. a static random access memory using thin-film transistors. A data decompression circuit 223 for decompressing the compressed data, which is stored in the memory circuit 222, into bitmap data, is formed adjacent to the memory circuit 222. The memory circuit 222 is also usable as a memory for storing the bitmap data that is generated by the data decompression circuit 223.

In order to simplify fabrication steps, it is particularly desirable to form the receiving circuit 221, memory circuit 222 and data decompression circuit 223 by using thin-film transistors that are formed on the glass substrate 201. Depending on cases, however, it is possible to separately form any one of the receiving circuit 221, memory circuit 222 and data decompression circuit 223 on one or more silicon chips, to mount the chip(s) on the glass substrate 201, and to electrically connect the chip(s) to other circuit components.

Figure 8:
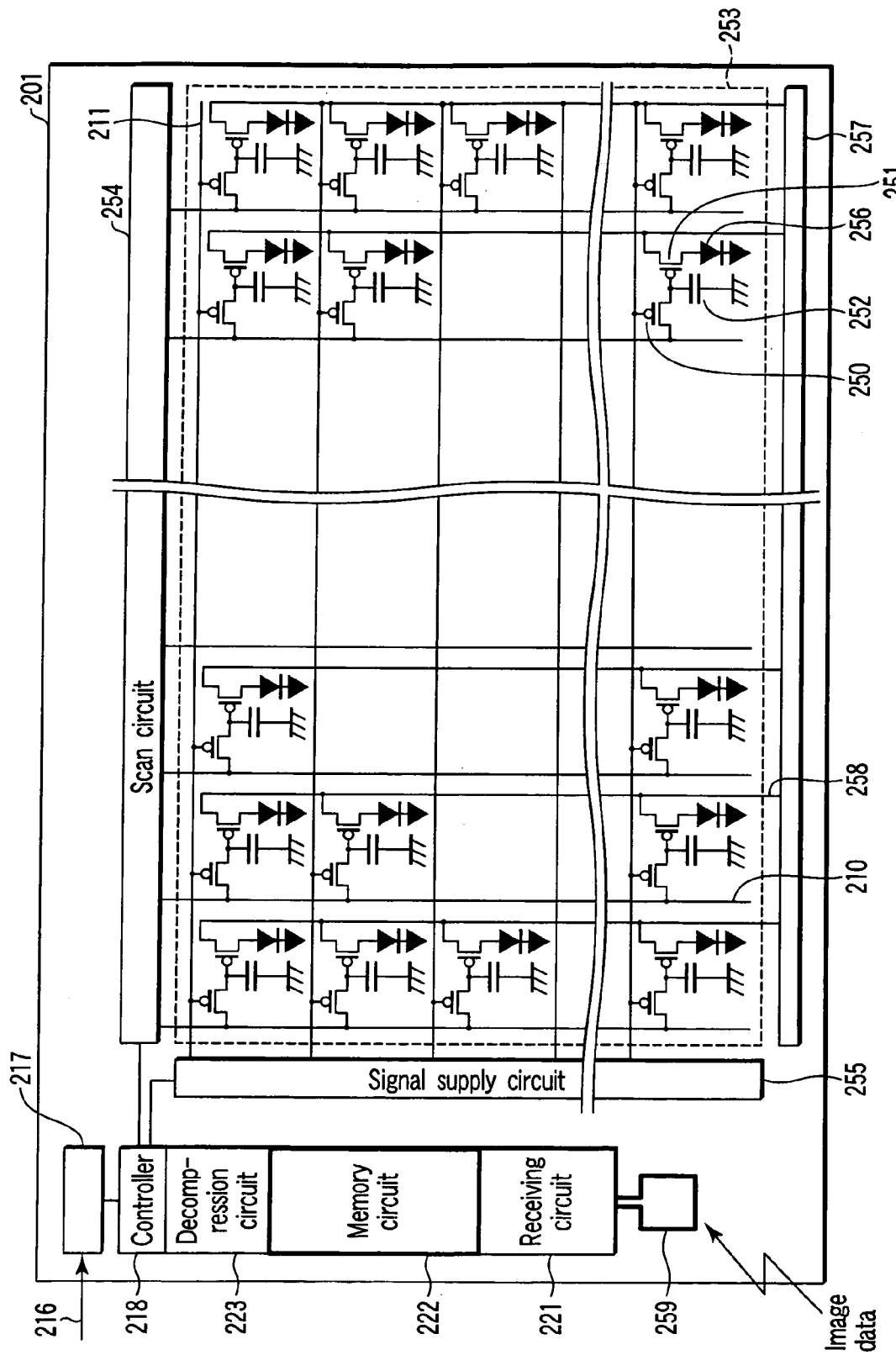
FIG. 8 shows the structure of an active matrix display apparatus according to a second embodiment of the invention.

In FIG. 3, reference numeral 236 denotes each of pixels of liquid crystal, and 224 denotes a thin-film transistor that controls the associated pixel. Each of the pixels is not limited to liquid crystal. Alternatively, each pixel may be formed of an organic electroluminescent element having proper control circuits 250-252, 254 and 255, as shown in FIG. 8 that relates to a second embodiment to be described later.

FIG. 4 is a perspective view that illustrates an example of the scheme of data transmission between the display substrate 200 and system substrate 230 using capacitive-coupling. An image data transmission circuit 232, which is formed of a semiconductor chip, and a pair of electrodes 233 and 234, which are connected to the transmission circuit 232, are formed on a printed circuit board 231 that constitutes the data transmission system.

The display substrate 200, on which the paired electrodes 219 and 220 for data reception are formed, is disposed close to the system substrate 230. In this case, the display substrate 200 and system substrate 230 are disposed such that the paired electrodes formed on the glass substrate 201 are opposed to the paired electrodes formed on the printed circuit board 231. In this embodiment, the electrodes 233 and 234 on the system substrate 230 supply transmission signals with mutually opposite phases. Preferably, a so-called differential-type non-contact transmission path using capacitive-coupling is formed by a capacitance between the associated electrodes 219 and 233 and a capacitance between the associated electrodes 220 and 234. The present invention, however, is not limited to the differential-type coupling.

Figure 5:
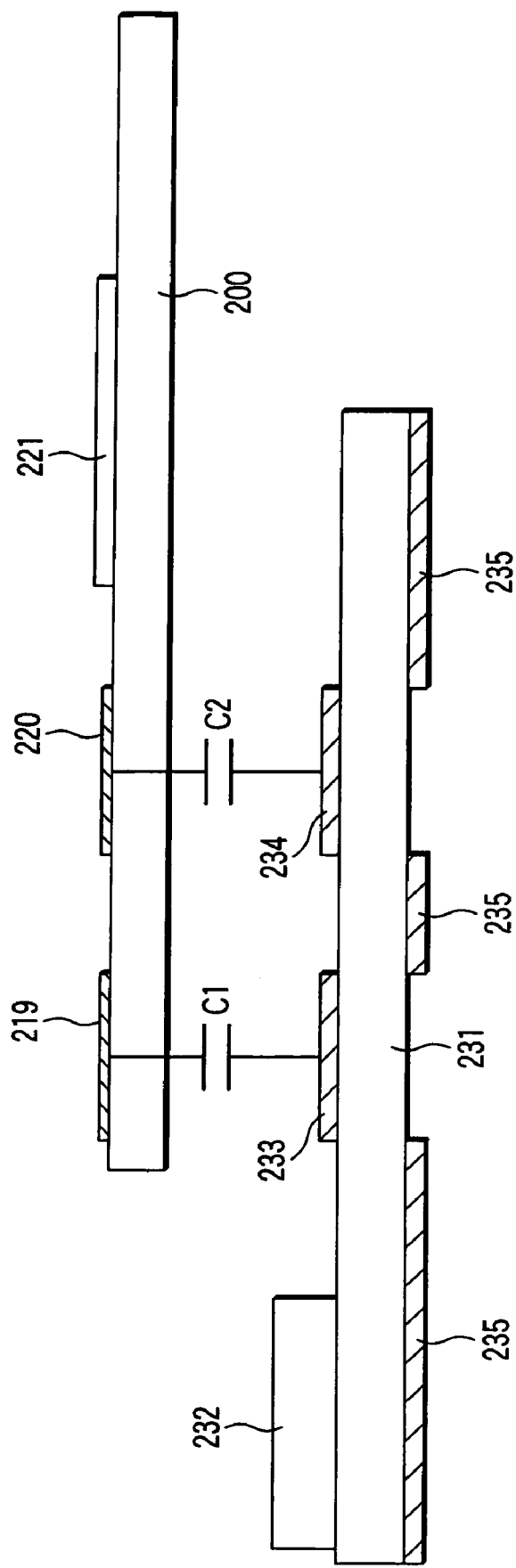
FIG. 5 is a schematic cross-sectional view that shows a differential-type capacitive-coupling non-contact transmission path in the embodiment of the invention.

FIG. 5 is a schematic cross-sectional view that shows the differential-type capacitive-coupling non-contact transmission line shown in FIG. 4. The image data transmission circuit 232 and the paired electrodes 233 and 234 are formed on the printed circuit board 231 that is the system substrate. The electrodes 233 and 234 are disposed to be opposed to the paired electrodes 219 and 220 on the display substrate 200. A capacitance C1 is provided between the electrodes 219 and 233 and a capacitance C2 is provided between the electrodes 220 and 234.

A signal voltage from the transmission circuit 232 induces a voltage between the paired electrodes 219 and 220 via the capacitances C1 and C2. The induced voltage is received and amplified by the thin-film transistor (not shown) in the data receiving circuit 221, and the resultant data is stored in the memory circuit 222 (not shown in FIG. 5). Reference numeral 235 denotes a ground electrode. In the non-contact transmission system as in the present embodiment, the reference potential of the system substrate 231 does not coincide with the reference potential of the display substrate 200. It is particularly desirable, therefore, to adopt the differential-type transmission system.

According to the present embodiment, at least the image memory circuit 222 and data decompression circuit 223 are provided on the display substrate 200. Thus, compressed data, which is to be decompressed, can directly be received from the system apparatus. Therefore, good image display is realized even in an environment in which a sufficient data transmission capacity of the data transmission path from the system apparatus is not always secured.

Figure 6:
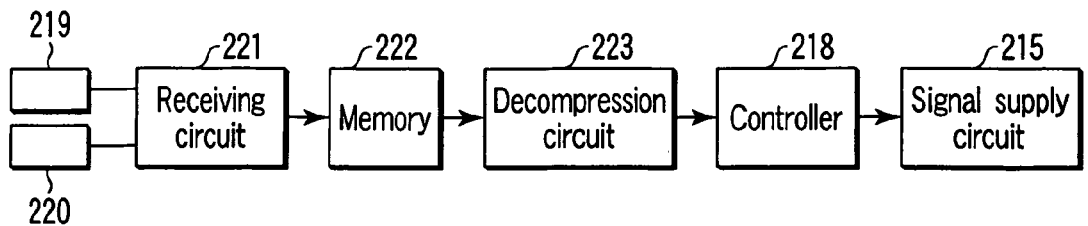
FIG. 6 is a block diagram of a circuit for generating bitmap data, which corresponds to each display bitmap, from compressed image data, the circuit being formed on the display substrate.

FIG. 6 shows a data processing circuit formed on the display substrate 200, which includes the paired electrodes 219 and 220, receiving circuit 221, memory 222, image decompression circuit 223, control circuit 218 and signal supply circuit 215. The circuit configuration of FIG. 6 uses the differential-type transmission system as shown in FIG. 5. Compressed image data, which is received by the receiving circuit 221 via the capacitances C1 and C2 by capacitive-coupling and amplified, is temporarily stored in the memory 222. Subsequently, the compressed image data is decompressed by the image decompression circuit 223, and bitmap data that corresponds to each display bitmap is generated. The bitmap data is supplied to the signal supply circuit 215 that is controlled by the control circuit 218. The memory 222 is also usable as a buffer circuit for temporarily storing the generated bitmap data.

Figure 7:
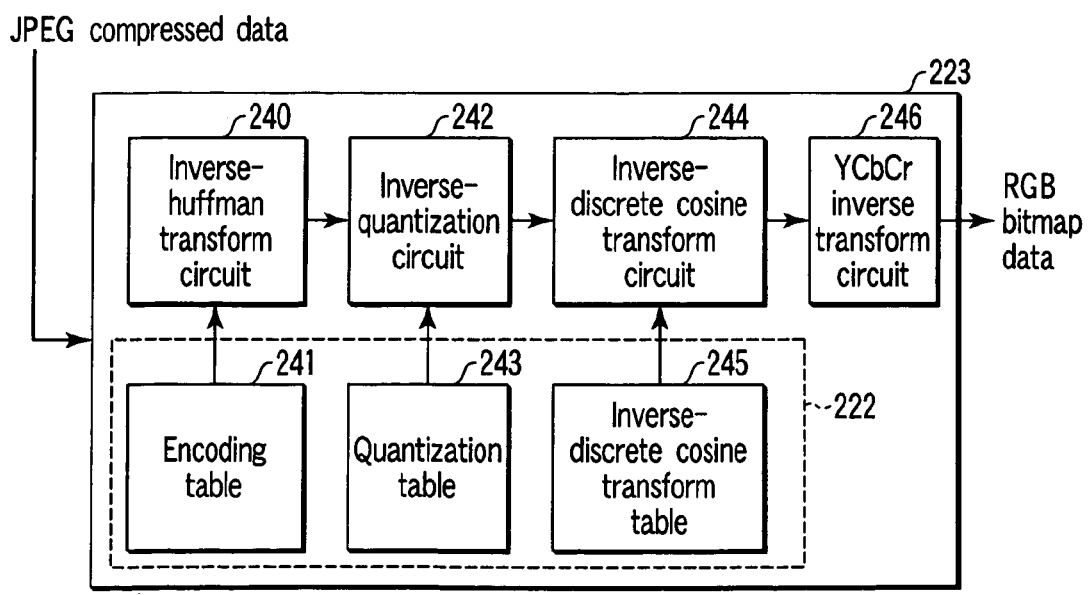
FIG. 7 is a block diagram that shows an example of the internal structure of a data decompression circuit for decompressing JPEG compressed image data.

Referring to FIG. 7, an example of the internal structure of the data decompression circuit 223 is described, taking as an example the decompression of JPEG compressed image data. JPEG compressed image data is generated in the following manner. A block of 64 (8×8) luminance/color difference (YCbCr format) image data is transformed to frequency information by discrete cosine transform (DCT) and the transformed data is quantized and rounded using proper parameters. The quantized data is compressed by entropy coding that is called Huffman coding. Decompression of data in the image decompression circuit 223 of the display apparatus is executed by reversing the above process flow.

The image data comprises three parts: header information, which is indicative of frequency JPEG data, a table, which stores parameters for encoding and quantization at the time of compression, and compressed image data. Of the input data, numeral value table information is stored in the memory circuit 222 in the decompression circuit 223.

The image data is decompressed by an inverse-Huffman transform circuit 240. In this case, a coding table 241 in the memory circuit 222 is referred to. The decompressed data is transformed to spatial frequency data by an inverse-quantization circuit 242. In this case, a quantization table 243 in the memory circuit 222 is referred to. Subsequently, the spatial frequency data is transformed to luminance/color difference data of each pixel by an inverse-discrete cosine transform circuit 244. In this case, an inverse-discrete cosine transform table 245 in the memory circuit 222 is referred to. At last, the YcbCr-format data is transformed to normal RGB data by a YCbCr inverse-transform circuit 246, and RGB bitmap data is output.

Second Embodiment

FIG. 8 shows the structure of an active matrix display apparatus according to a second embodiment of the present invention. The embodiment of FIG. 8 is characterized in that an inductor, which is formed, for example, by winding a metal thin film by a predetermined number of turns, is used as an element for receiving compressed image data from outside.

Like the embodiment of FIG. 3, a plurality of scan lines 210 and a plurality of video signal lines 211 are arranged in a matrix on a no-alkali glass substrate 201 that is an insulating substrate. Unlike the embodiment of FIG. 3, a thin-film transistor active matrix region 253 is formed such that two P-type thin-film transistors 250 and 251, a capacitance element 252 and a pixel 256 are disposed in each of a plurality of rectangular pixel regions that are defined by the lines 210 and 211. A scan circuit 254 and a signal supply circuit 255, which are formed using thin-film transistors, are disposed in order to drive the thin-film transistors in the respective pixel regions.

In the second embodiment of FIG. 8, a current is supplied to the pixel 256 that is an organic electroluminescent element, thereby causing the pixel 256 to emit light. Thus, a display operation is performed. The second embodiment includes a current supply source 257 for supplying a current to each organic electroluminescent element. The transistors 250 and 251, which are provided in the thin-film transistor active matrix region 253, are supplied with current via current supply lines 258 that are formed on the same substrate.

A DC/DC converter circuit 217 and a timing control circuit 218, which are also formed using thin-film transistors, are integrated on the glass substrate 201. The DC/DC converter circuit 217 converts a power supply voltage 216 from outside and supplies necessary voltages to drive circuits 254 and 255. The timing control circuit 218 receives video data, control signals, etc., executes necessary processing, and supplies timing signals to the scan drive circuit 254 and signal supply drive circuit 255.

In the present embodiment, an inductor 259, which is formed by winding a metal thin film by a predetermined number of turns, is used as an element for receiving compressed image data from outside. In the present embodiment, the inductor 259 is formed on a region on the glass substrate 201, which is outside the thin-film transistor active matrix region 253. The inductor 259 is connected to a receiving circuit 221 on the glass substrate 201. A semiconductor memory circuit 222 temporarily stores image data, which is received by the receiving circuit 221. A data decompression circuit 223 for decompressing the compressed data, which is stored in the memory circuit 222, into bitmap data, is formed adjacent to the memory circuit 222.

In order to simplify fabrication steps, it is particularly desirable to form the receiving circuit 221, semiconductor memory circuit 222 and data decompression circuit 223 by using thin-film transistors that are formed on the glass substrate 201. Depending on cases, however, it is possible to separately form the receiving circuit 221, and/or memory circuit 222, and/or data decompression circuit 223 on one or more silicon chips, to mount the chip(s) on the glass substrate 201, and to electrically connect the chip(s) to other circuit components.

Figure 9:
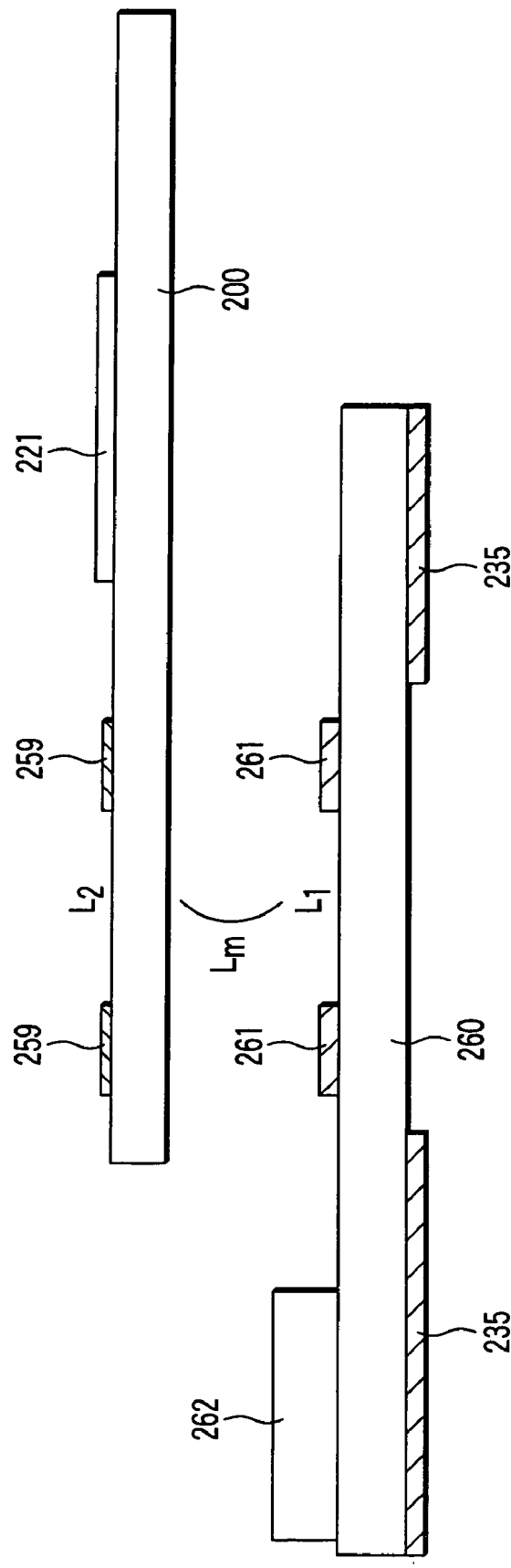
FIG. 9 is a schematic cross-sectional view that shows an inductive-coupling non-contact transmission path according to the embodiment of the invention.

FIG. 9 is a schematic cross-sectional view that illustrates an inductive-coupling non-contact transmission line that is constituted by the inductor element 259, which is formed on the display substrate 200, and an associated inductor element 261, which is formed on a substrate 260 of the data transmission-side system.

An image data transmission circuit 262 and the inductor 261 with a self-inductance L1 are formed on the system substrate 260. The inductor 261 is disposed substantially coaxial with the inductor 259 with a self-inductance L2 on the display substrate 200. A signal voltage from the image data transmission circuit 262 is transmitted from the inductor 261 to the inductor 259 via a mutual inductance Lm between the inductors 261 and 259. The signal received by the receiving circuit 221 via the inductor 259 is accumulated in the memory circuit 222 shown in FIG. 8.

According to the present embodiment, as shown in FIG. 8, the image memory circuit 222 and data decompression circuit 223 are provided on the display substrate 200. Thus, compressed data can directly be received from the system apparatus (not shown). Therefore, good image display is realized even in an environment in which a sufficient data transmission capacity of the data transmission path from the system apparatus is not always secured.

Each of the pixels is not limited to the organic electroluminescent element as shown in FIG. 8. Alternatively, each pixel may be formed of the liquid crystal 236 having proper control circuits 214 and 215, as shown in FIG. 3.

Third Embodiment

Figure 10:
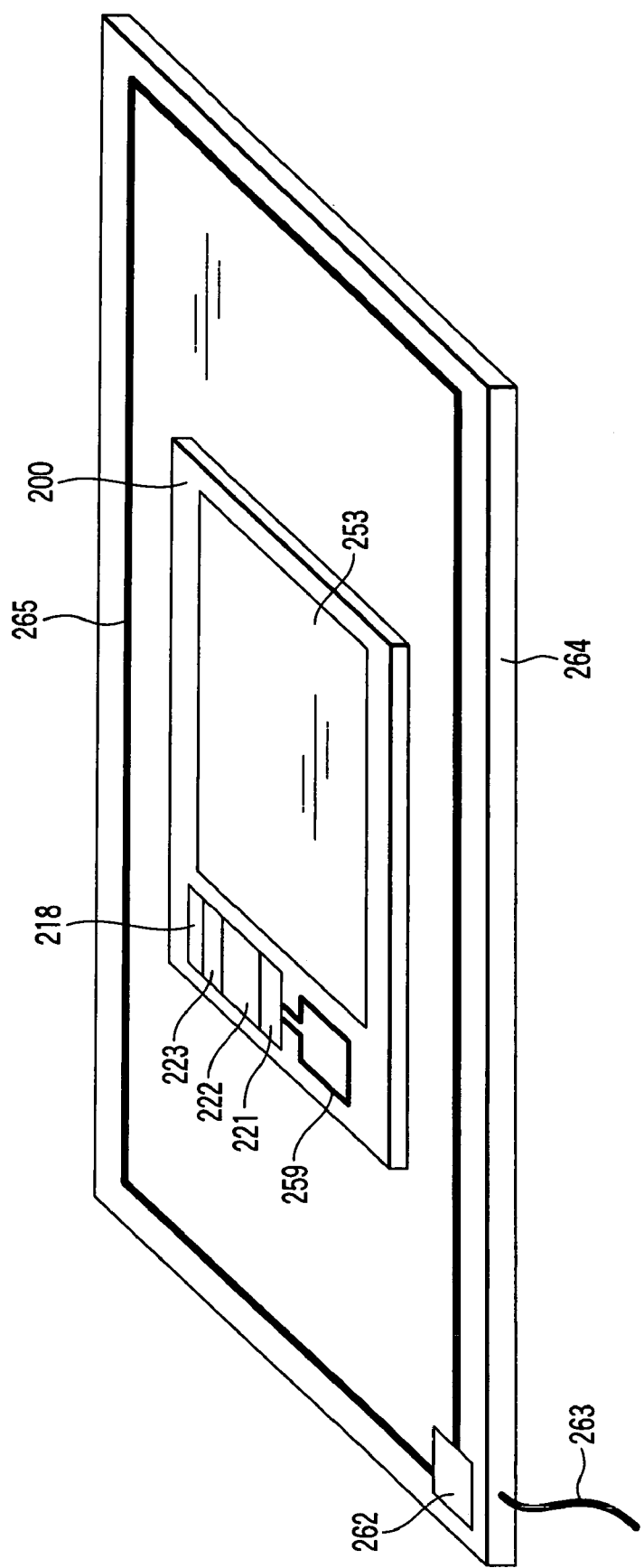
FIG. 10 is a perspective view that shows a display apparatus and a system apparatus according to a third embodiment of the invention.

FIG. 10 is a perspective view that shows a display substrate 200 and a working table 264 of the system apparatus, according to a third embodiment of the present invention.

In the present embodiment, the display apparatus 200 includes, like the second embodiment, a inductive-coupling non-contact transmission line. A receiving inductor element 259 for forming the non-contact transmission line is provided on the display substrate 200. On the other hand, the working table 264 having a larger area than the display substrate 200 is provided on the system substrate side. A transmission circuit 262 and a transmission inductor element 265 are formed on the working table 264. The working table 264 receives a necessary image signal from an external system apparatus (not shown) over a connection cable 263.

The working table 264 itself may be a separate display apparatus, and a system including a plurality of display apparatuses may be constituted along with the display substrate 200. The transmission inductor element 265 and receiving inductor element 259 may be formed with different sizes. In the case of FIG. 10, the winding portion of the transmission inductor element 265 is larger than that of the reception inductor element 259.

According to the present embodiment, inductive-coupling occurs between the transmission inductor element 265 and receiving inductor element 259 by positioning the display substrate 200 close to the working table 264. Thereby, data transfer is executed, and display is effected on the display substrate 200. It should suffice if the display substrate 200 is positioned close to the working table 264. No cable is needed for data transfer, and a display device with good mobility is realized.

Particularly in the second and third embodiments (i.e., electromagnetically coupled transmission paths), the inductors may be mounted on, for example, an insulating substrate such as a glass substrate, together with TFTs, forming an integrated circuit. Then, the inductors can easily acquire a large quality-factor. As a result, the transmission paths can have its performance factors including transmission-band width and the like.

Moreover, Si chips are not mounted as signal-amplifying circuits, and TFT amplifying circuits, each comprising a TFT and an inductor that are formed on a glass substrate, are used. A bonding terminal need not be used to connect Si chips. Thus, no parasitic capacitance will be generated. This fact and the use of low-loss inductors help to enhance the performance of the transmission path.

Fourth Embodiment

Figure 11:
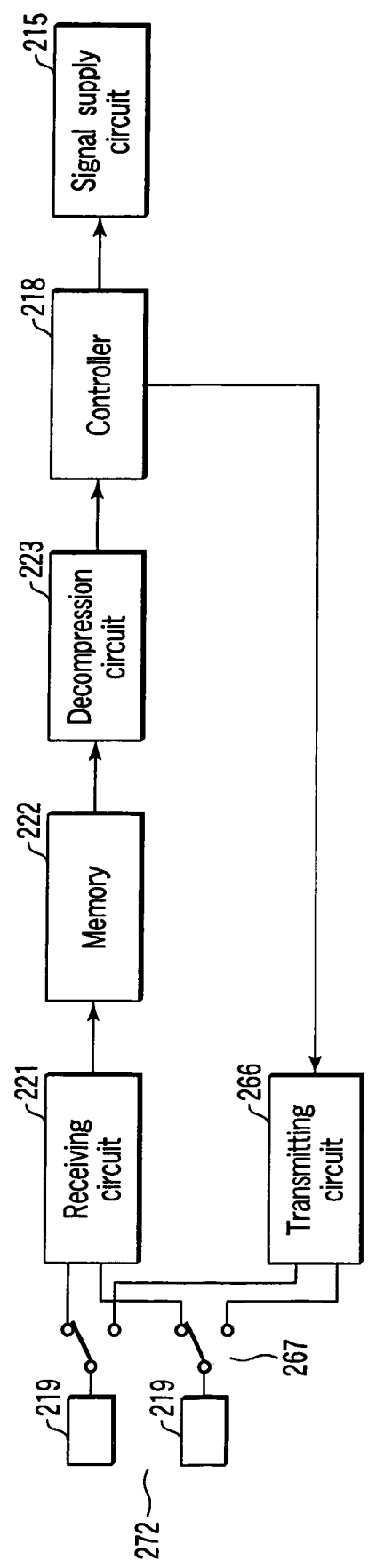
FIG. 11 is a circuit diagram that shows a signal processing circuit including a transmission circuit, according to a fourth embodiment of the invention.

FIG. 11 is a circuit diagram that shows a signal processing circuit according to a fourth embodiment of the invention. A transmission/reception antenna for non-contact transmission and a transmission circuit and a switch using thin-film transistors are formed on the insulating substrate of the first embodiment. The switch is operated to effect switching between reception from the system apparatus and transmission to the system apparatus. Two-way signal reception/transmission is thus enabled.

The signal processing circuit in FIG. 11 is common to that shown in FIG. 3 in that the signal processing circuit includes the paired electrodes 219 for reception, receiving circuit 221, memory circuit 222, data decompression circuit 223, timing control circuit 218 and signal supply circuit 215. In the embodiment of FIG. 11, the electrodes 219 function as an antenna for both reception and transmission. A transmission circuit 266 for transmission from the display substrate 200 to the system side is further formed on the glass substrate. Transmission/reception is switched by the switch 267, which is formed using thin-film transistors, and thus two-way signal transmission/reception is enabled. A circuit, which has the same function as an ordinary signal processing circuit for wireless transmission, is applicable to the transmission circuit 266. In this embodiment, the capacitive-coupling transmission line is used. Alternatively, like the second embodiment, the inductive-coupling transmission line using inductor elements may be used.

With the integration of the transmission circuit on the substrate, the display side can receive signals from the system side and can transmit signals to the system side. With this function, a signal that is collected by a sensor (not shown) on the display substrate 200, such as voice, temperature/brightness information or internal-state information of the display, can be fed back to the system. Therefore, various functions, such as a finer display control or an overall system control by voice or physical contact, can be realized without an increase in cost.

Fifth Embodiment

Figure 12:
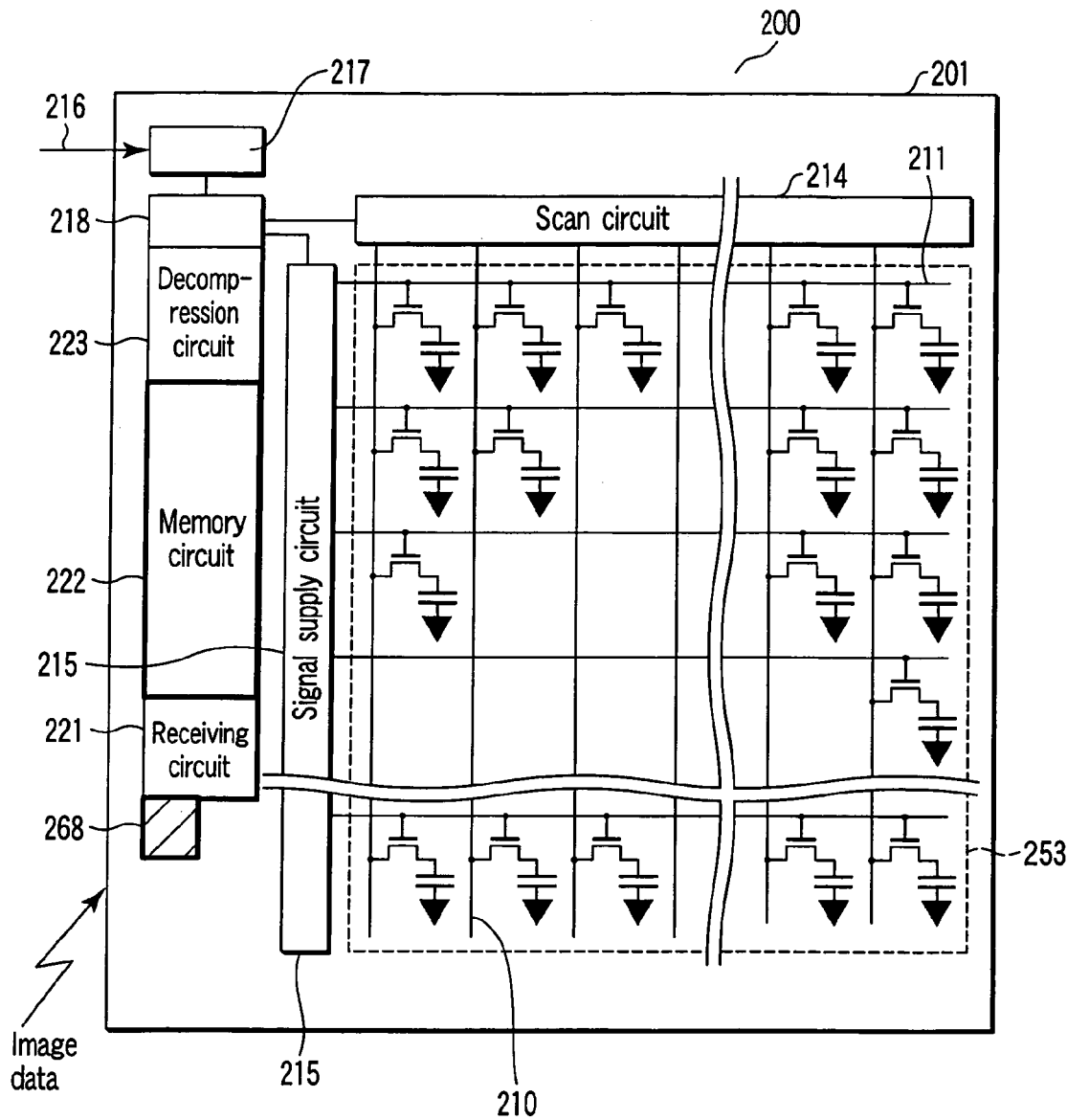
FIG. 12 shows a display substrate including an optical receiving circuit, according to a fifth embodiment of the invention.
Figure 13:
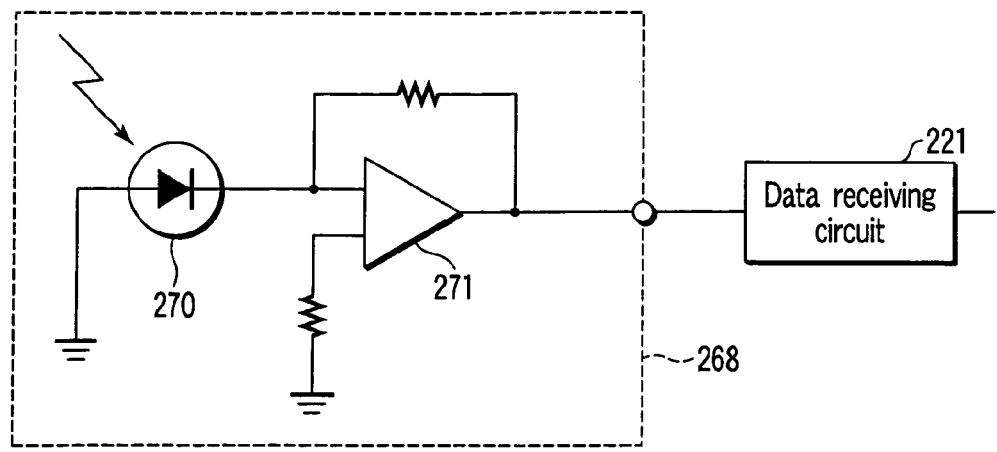
FIG. 13 shows an example of the optical receiving circuit of the invention.

FIG. 12 and FIG. 13 show a display substrate 200 and an optical receiving circuit 268 according to a fifth embodiment of the present invention. In the fifth embodiment, the capacitive-coupling signal transmission in the first embodiment is replaced with optical-coupling non-contact signal transmission.

In this embodiment, an optical transmission line is used as transmission means. Instead of the capacitance or the inductor, an optical sensor 269 is integrated on the display substrate 200. FIG. 13 shows an example of the internal structure of the optical sensor 269. In this example, the optical sensor 269 includes a photodiode 270, which is formed using a single-crystal silicon thin film, and an amplifier circuit 271.

Although not shown, like the fourth embodiment, signal transmission means may be provided in addition to the optical receiving circuit. For signal transmission from the display side, an LED or a laser diode (not shown), for instance, which is separately provided on a wiring board, may be used. Alternatively, the LED or laser diode may be disposed on the display substrate 200.

By making use of light for signal transmission means, the effect of noise can be reduced and a good SN radio can be achieved. Thereby, the transmission rate can be enhanced. In particular, if a photodiode, which is formed using a single-crystal silicon thin film on a transparent glass substrate, is used, signals can be received even where the transmission circuit is disposed on either of the top surface or back surface of the glass substrate. Therefore, the degree of freedom of disposition of the transmission circuit is increased.

Sixth Embodiment

Figure 14:
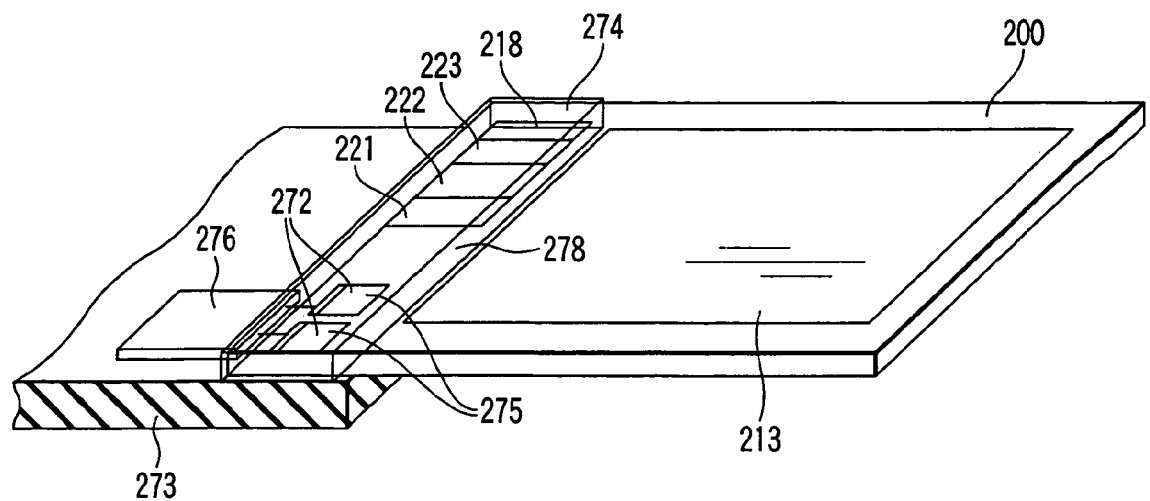
FIG. 14 shows a non-contact type system/display interface according to a sixth embodiment of the invention.
Figure 15:
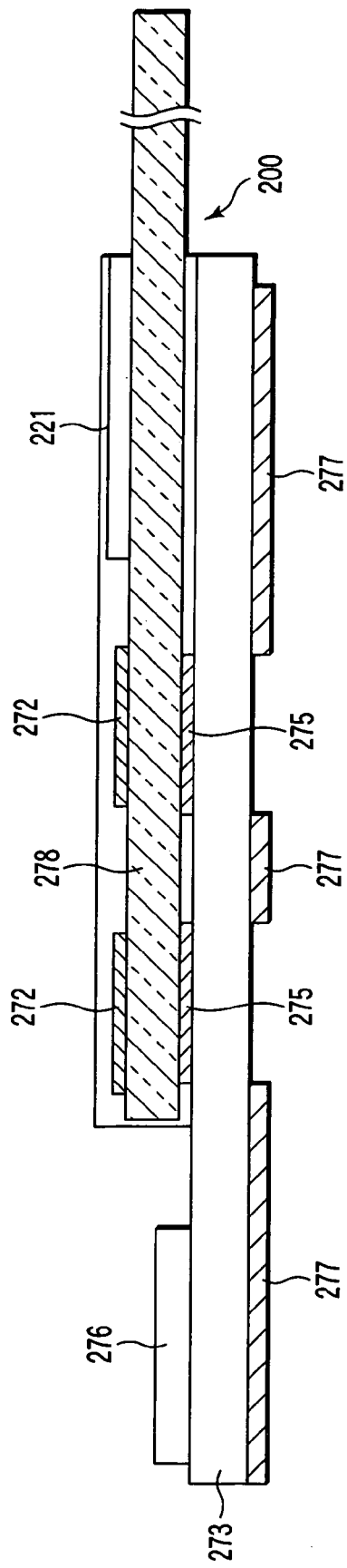
FIG. 15 is a cross-sectional view of the non-contact type system/display interface shown in FIG. 14.

FIG. 14 and FIG. 15 show an embodiment that shows another example of the use of the non-contact system/display interface shown in FIG. 3. In this embodiment, the display substrate 200 is used in the state in which it is coupled to a connection slot 274 that is formed in the external system. For this purpose, the display substrate 200 has a connection end portion 278 that is to be inserted in the connection slot 274. The signal transmission scheme in the embodiment of FIG. 14 is electrostatic-coupling differential transmission using two capacitance elements. The present invention, however, is not limited to the electrostatic-coupling transmission, and inductive-coupling or optical coupling may also be used.

As is shown in FIG. 14 and FIG. 15, a reception antenna 272 is formed at one end of the display substrate 200. The slot 274 for insertion of the display substrate 200 is provided on the system-side wiring substrate 273. A transmission antenna 275, which is electrically connected to the system-side transmission circuit 276, is disposed in the slot 274. The reception antenna 272 on the connection end portion 278 of the display substrate 200 is connected to the data receiving circuit 221.

The system-side wiring substrate 273 and display substrate 200 are disposed such that the reception antenna 272 and transmission antenna 275 are opposed to each other in the slot 274. With this structure, the electrostatic-coupling differential transmission line is automatically constituted by simply inserting and fixing the display substrate 200 in the slot 274 on the wiring substrate 273, and signal transmission/reception is executed. Normally, a ground line 277 is provided on the wiring substrate 273.

According to the sixth embodiment, there is no need to use a so-called flexible wiring board that is conventionally used for connecting the system-side substrate 273 and the display substrate 200. In addition, assembly is easy and a fabrication step of thermal press-bonding for a flexible wiring board is needless. Therefore, the manufacturing cost of products can be reduced.

In the first to sixth embodiments, each display apparatus can be formed in a portable thin-card shape. (Seventh Embodiment; Formation of Semiconductor Thin Film).

Image display using the non-contact transmission path according to the present invention can be realized using such an amorphous silicon thin film formed on, e.g. a glass substrate, as is usually used in fabrication of thin-film transistors. In general, an amorphous silicon thin film is annealed and used.

However, in the present invention, it is particularly effectively to use a substrate 302 as the display substrate. The substrate 302 has a plurality of regions 301, which are substantially formed of single-crystal thin films in an arrayed shape, as will be described later. With this substrate, a plurality of regions, which are substantially formed of single-crystal thin films, can uniformly be obtained in the entirety of the large-area substrate that is needed for the display apparatus. The word "substantially", in this context, means that although each region should preferably be formed of a perfect single-crystal thin film, there may be a case where the region is formed of a plurality of single-crystal regions when crystal growth is performed by the method of the invention that is described below.

Figure 16:
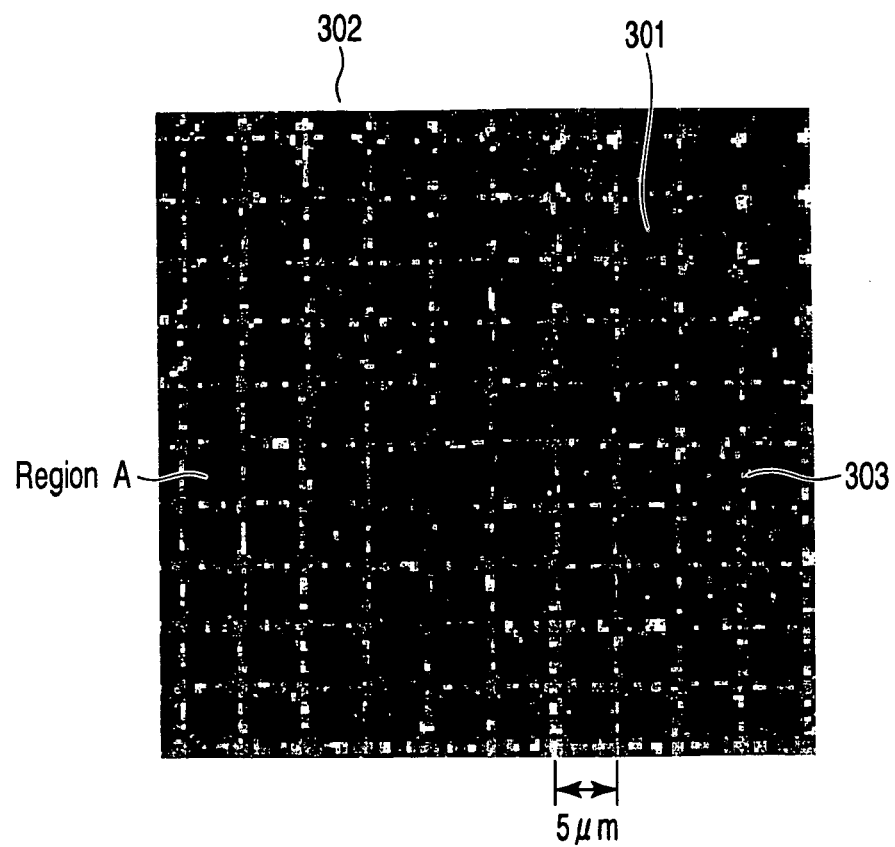
FIG. 16 is a scanning electron-microscope image of a crystal array pattern that is usable in the first and second embodiments of the present invention.

FIG. 16 is an electron-microscopic image of the substrate 302. Although the substrate, in which a plurality of regions are formed of arrayed single-crystal thin films, is not limited to the glass substrate, the substrate 302 in this embodiment is formed of a transparent glass substrate. The substrate for the display is configured such that regions of, e.g. silicon thin films, which are arranged in a two-dimensional matrix and are each formed of a silicon thin film with a size of about 5 µm×5 µm, are arranged at vertical and horizontal intervals of, e.g. 5 µm.

In FIG. 16, polycrystalline regions 303 are present at boundary regions that surround individual single-crystal regions, and there are a great number of crystal grain boundaries 304. Electrically active defects, which function as centers of generation/re-coupling of carriers, are present in the grain boundaries 304. Thus, the polycrystalline regions 303 are excluded from formation regions of channels of thin-film transistors.

Figure 17:
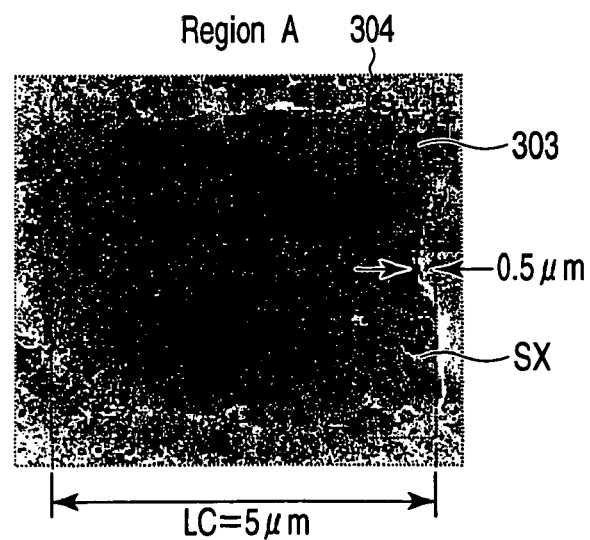
FIG. 17 is an enlarged view of the scanning electron-microscope image shown in FIG. 16, which relates to the crystal array pattern that is usable in the embodiments of the present invention.

FIG. 17 is an enlarged view of region A that is one of single-crystal regions in FIG. 16. In the region with a size of 5 µm, a peripheral region of about 0.5 µm is the polycrystalline region 303 and includes many defects occurring at grain boundaries. Thus, the channel region of the transistor needs to be disposed so as not to include the defective region 303 of about 0.5 µm.

The method of fabricating this substrate is described in detail in the specification of Japanese Patent Application No. 03-209598 that was filed Aug. 29, 2003 by the same applicant as the present application.

A description will now be given of an example of the method of forming a thin-film array including substantially rectangular single-crystal regions that are arranged with a pitch of 5 µm and each have one side of about 4 µm.

In the case where the substrate that is used as a display substrate is a glass substrate, high temperatures that can be used in fabricating silicon wafers cannot be used in order to form a single crystal. At first, an amorphous silicon thin film, for instance, is formed on the glass substrate by a proper method. Subsequently, a pulse-like ultraviolet laser beam is applied to the amorphous silicon thin film, thereby melting the amorphous silicon thin film. Then, the molten silicon is re-crystallized, and a silicon thin film that is partially made into a single crystal is obtained. In this embodiment, silicon is used. However, the semiconductor material is not limited to silicon. For instance, semiconductor materials of Group III-V may be used.

In one method of re-crystallization, which aims at obtaining a largest possible single-crystal region, a thin film is melted while a temperature gradient is given to parts of the array. Then, the temperature of the substrate is decreased while the temperature gradient is being kept, and thus re-crystallization is effected. To achieve this, a phase shift mask with a proper pattern is used to provide a spatial distribution to the intensity of a laser beam that is applied to the substrate surface. Thereby, a temperature gradient is provided in the lateral direction. With this method, even after the irradiation of the laser beam, the temperatures of the respective parts of the substrate decrease on the basis of the temperature gradient at the time of melting, and crystal growth in the lateral direction occurs successively from the low-temperature part toward the high-temperature part. Thus, from the initially produced polycrystalline portion, crystal growth progresses with a seed of crystal portion that is particularly suited to crystal growth. Depending on cases, a plurality of single-crystal regions may grow. Even in such cases, the size of the grown crystal is normally greater than the size of the channel region of the thin-film transistor. This method can provide an array including a plurality of substantially single-crystal regions 301, each of which has a substantially rectangular shape with a dimension of about 4 µm of each side.

Figure 18A:
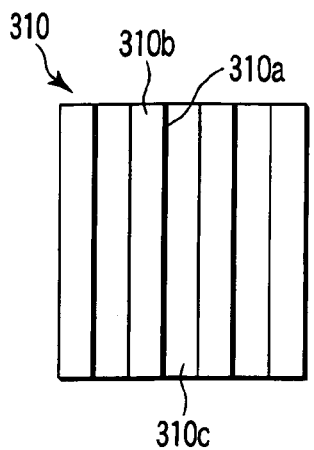
FIG. 18A to FIG. 18C show phase-shift masks that are used in order to obtain single-crystal arrays in the present invention.

Next, the re-crystallization step using, e.g. a phase shift mask is described referring to FIGS. 18A to 18C and FIG. 19. A phase shift mask 310 shown in FIG. 18A is configured such that a transparent medium, such as a quartz medium, is provided with mutually adjacent regions with different thicknesses. At a stepped boundary portion (phase shift portion) between the regions, diffraction or interference occurs between incident laser beams. In this manner, a cyclic spatial distribution is imparted to the intensity of the incident laser beam.

The phase shift mask 310 is so configured as to have adjacent patterns with opposite phases (180° phase difference). Specifically, alternately arranged regions comprise a first strip region (phase region) 310b with a phase π and a second strip region (phase region) 310c with a phase 0. Each strip region (phase shift line region) has a width of 10 μm in this example. To be more specific, the phase shift mask 310 is fabricated by pattern-etching a rectangular quarts plate with a refractive index of 1.5 so as to have a depth corresponding to a phase π relative to light with a wavelength of 248 nm, that is, a depth of 248 nm. The region that is thinned by etching becomes the first strip region 310b, and the non-etched region becomes the second strip region 310c.

Figure 19:
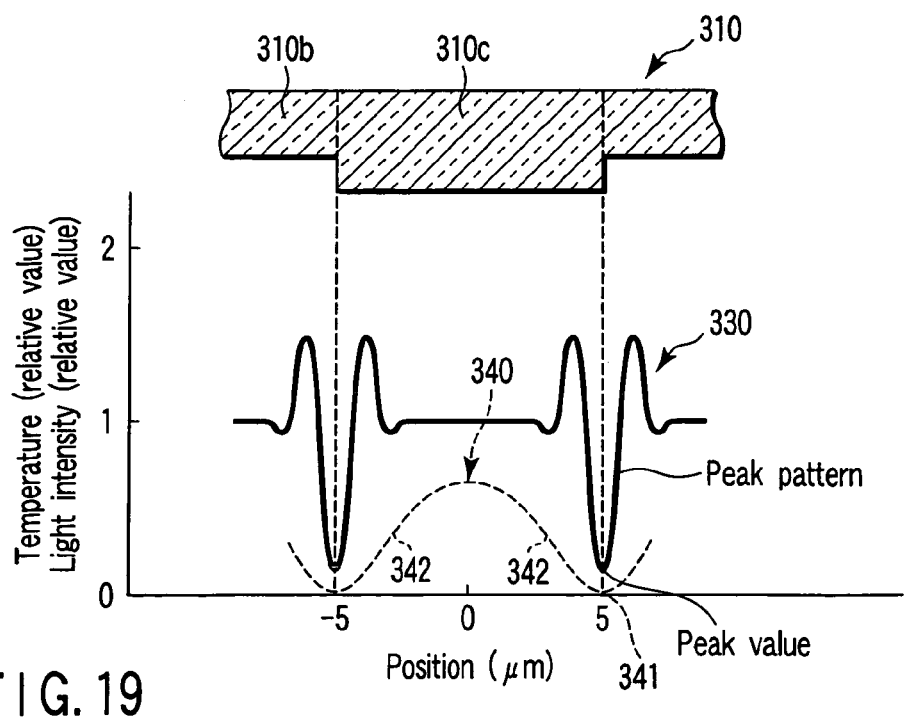
FIG. 19 is a graph that shows a laser beam intensity distribution and a temperature distribution in a phase-shift crystallization method that is used in order to obtain a single-crystal array.

In the phase shift mask 310 with this structure, a laser beam that has passed through the thick second phase region 310c delays by 180°, relative to a laser beam that has passed through the thin first phase region 310b. As a result, interference and diffraction occur between laser beams. A laser beam intensity distribution 330, as shown in FIG. 19, is obtained. Specifically, since laser beams that have passed through adjacent phase regions have opposite phases, a laser beam that has passed through the phase shift portion between the adjacent phase regions has a minimum light intensity, for example, 0. The temperature of the portion with the minimum light intensity decreases to the minimum, and a cyclic temperature distribution 340 is provided on the substrate surface.

When the irradiation of the laser beam is stopped, a minimum-temperature region 341 or a region near the region 341 has a temperature of a melting point or lower, and a great number of polycrystals that are nuclei for semiconductor re-crystallization occur in the region. At first, polycrystals are produced in the minimum-temperature region 341. However, while crystals are grown in succession in accordance with the temperature gradient, a crystal portion with a crystal orientation, which is particularly suitable for crystal growth, grows and a substantially single-crystal region is obtained at each temperature gradient portion 342.

In the above description, the phase shift mask 310 is configured to have mutually parallel, linear phase shift portions, as shown in FIG. 18A. Alternatively, phase shift lines may be crossed at right angles so that regions with phase 0 and regions with phase π are arranged in a checkered fashion (not shown). In this case, lattice-shaped regions with light intensity of 0 are formed along the phase shift lines. Since the crystal nuclei are produced at given positions along the phase shift lines, it becomes difficult, in some cases, to control the positions and shapes of crystal grains.

In order to control the occurrence of crystal nuclei, it is desirable that the regions with light intensity of 0 be distributed in dots with predetermined cycles. In one method for achieving this, the phase shift amount of each of crossed phase shift lines is set to be less than 180°. In this case, the light intensity at a position corresponding to each phase shift line does not become 0, though it deceases. However, by properly choosing the shift amount, as described below, the sum of complex transmittance in the vicinity of the intersection of the phase shift lines can be reduced to 0. In this case, the light intensity at the intersection can be reduced to 0.

Figure 18B:
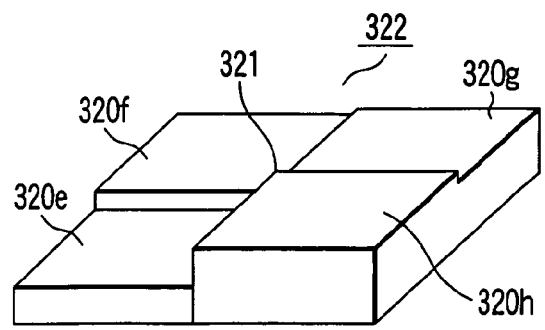
Figure 18C:
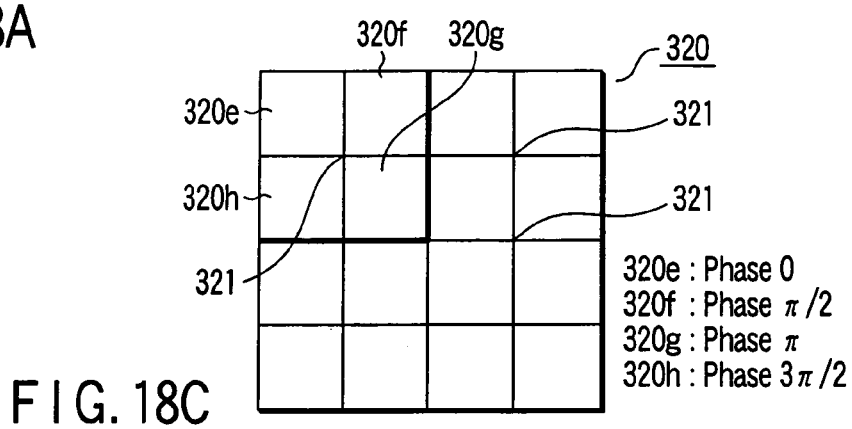

This example is described referring to FIG. 18B and FIG. 18C. A mask 320 includes a plurality of square patterns 322 each comprising four square regions 320e, 320f, 320g and 320h, which have different thicknesses, as shown in FIG. 18B. In each pattern, as shown in FIGS. 18B and 18C, the first region 320e is the thinnest and has a phase 0. The fourth region 320h is the thickest and has a phase that shifts from the phase of the first region 320e by 3π/2. The second and third regions 320f and 320g have thicknesses between the thicknesses of the first and fourth regions 320e and 320h and have phases that shift from the phase of the first region 320e by π/2 and π, respectively.

In the above-described mask, the center point 321 of the square pattern, at which the first to fourth regions 320e to 320h adjoin, has an intensity 0. Therefore, this center point becomes a nucleus of crystal growth. In FIG. 18C, the center point of the pattern, that is, each lattice point 321, can be set to have the intensity 0. Therefore, the position of formation of a crystal grain can easily be controlled. The technique of using this phase shift mask is disclosed in International Application PCT/JP03/03366 that was filed on Mar. 19, 2003 by the same applicant as the present application with claim to priority based on Japanese Patent Application No. 2002-120312. (Eighth Embodiment; Formation of Semiconductor Circuit).

Various logic cells are included in the receiving circuit 221, memory 222, image decompression circuit 223 and control circuit 218, which are shown in FIG. 3 or FIG. 8. Such logic cells can be formed using a plurality of predetermined standard structures relating to logic parts that are registered in cell libraries. A description will now be given of the structures of a CMOS inverter circuit cell, an AND circuit cell, an XOR circuit cell and a half adder circuit, which are included in the logic cells.

Figure 20:
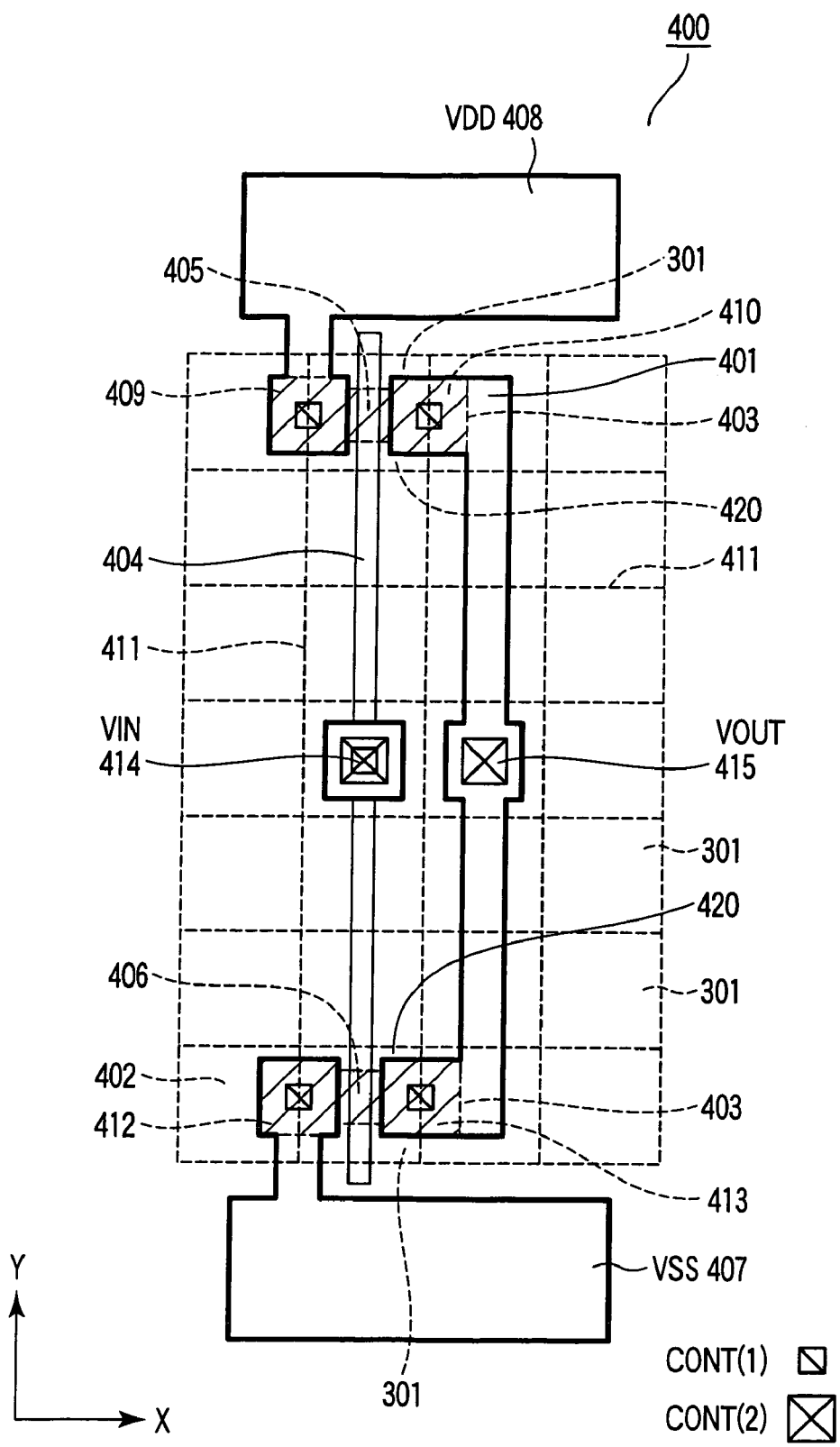
FIG. 20 is a plan view of an inverter circuit cell that is used in the embodiments of the invention.

FIG. 20 is a plan view of a CMOS inverter circuit cell 400 that is provided on the single-crystal array structure shown in FIG. 16. A pattern of single-crystal regions 301, which are arranged in a matrix with seven rows in a Y-direction and four columns in an X-direction, is an imaginary pattern for circuit pattern layout. Semiconductor thin-film portions at peripheral regions of semiconductor islands 403, where thin-film transistors are formed, are removed by, e.g. etching, for isolation between the thin-film transistors. Thus, such semiconductor thin-film portions are not left in a finished product. In this example, the single-crystal region 301 is a square with a dimension of 4 μm on each side.

In FIG. 20, two semiconductor islands 403 are provided for formation of a P-type MOS transistor 401 and an N-type MOS transistor 402. A channel 405, 406 of each transistor is formed at an intersection between the semiconductor island 403 and the gate electrode 404. The channel length of each of the P-channel and N-channel is, e.g. 1 μm. The channel width of the P-channel is, e.g. 2 μm, and the channel width of the N-channel is, e.g. 1 μm. The present embodiment is characterized in that the channel region is positioned at a substantially central part of the associated single-crystal region 301. Thus, in this example, the channel regions of the transistors 401, 402 are disposed only at intervals of 5 μm, which is equal to the pitch of single-crystal regions 301, in both the X-direction and Y-direction.

A ground line VSS 407 is formed of first-layer AL wiring, and a power supply line VDD 408 is formed of the first-layer AL wiring. A through-hole CONT(1) is formed to connect a semiconductor layer and a gate electrode layer to the first-layer wiring. A through-hole CONT(2) is formed to connect the first-layer AL wiring within the cell to second-layer AL wiring for connecting other cells. The contact through-hole CONT(1) is formed within the semiconductor single-crystal region 301. A source region 409, 412 and a drain region 410, 413, which are formed of high-concentration impurity regions, are disposed so as to extend over polycrystal regions 411 in which grain boundaries are present. However, the transistor can normally operate if the source/drain region has a desired low resistance value, and there is no problem even if grain boundaries are present.

VIN 414 and VOUT 415 designate a signal input portion and a signal output portion of the inverter cell 400. Automatic wiring software, which is described later, recognizes the positions of VIN 404 and VOUT 415, and executes inter-cell wiring.

FIG. 21 is a logic circuit diagram of the cell shown in FIG. 20, and FIG. 22 is a circuit diagram of the cell. The circuit diagram of FIG. 22 schematically shows that the channel region of each MOS transistor is disposed within the single-crystal region 301.

Figure 23A:
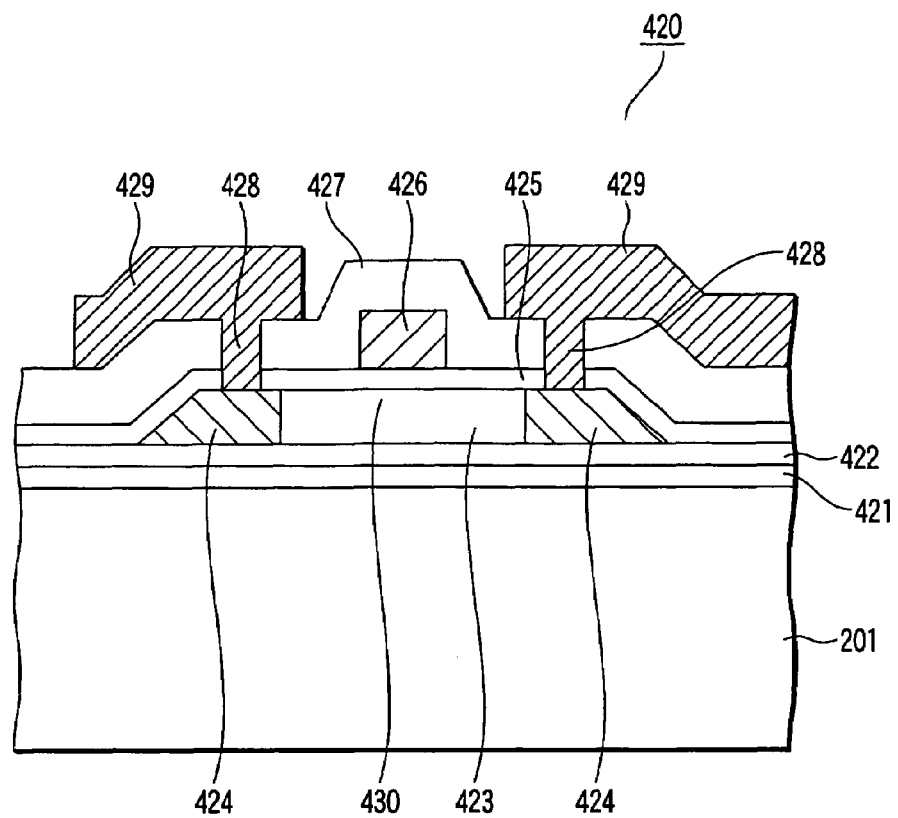
FIG. 23A is a cross-sectional view of a thin-film transistor according to an embodiment of the present invention.
Figure 23B:
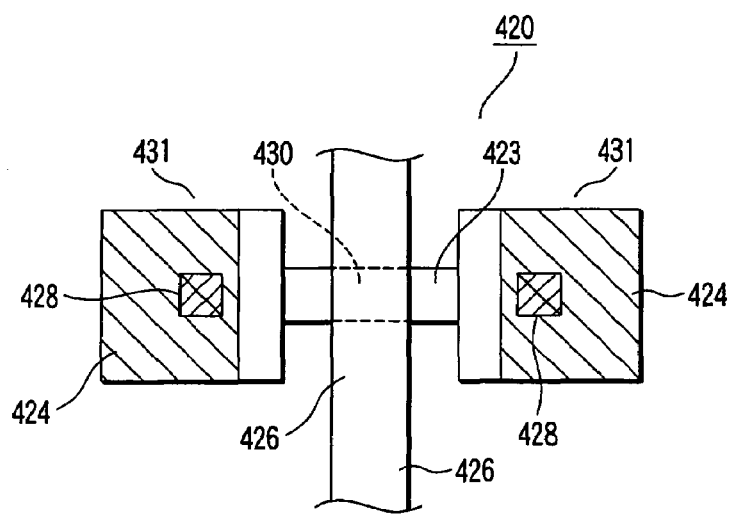
FIG. 23B is a plan view of the thin-film transistor shown in FIG. 23A.

FIG. 23A is a cross-sectional view of a P-type or N-type thin-film transistor 420 that is commonly usable in the circuit of FIG. 20 and in the circuits shown in FIGS. 24, 27 and 29, which are described later. FIG. 23B is a plan view of the transistor 420. In this example, polycrystal regions 424 are formed at both ends of a central single-crystal region 423.

A buffer insulation film, which comprises an SiNx film 421 with a thickness of, e.g. 50 nm and an SiO$_2$ film 422 with a thickness of, e.g. 100 nm, is formed on a glass substrate 201. The buffer insulation film prevents diffusion of impurities from the glass substrate 201. A silicon thin film with a thickness of, e.g. 200 nm is formed on the SiO$_2$ film 422. The silicon thin film includes a silicon polycrystal region 424 and an adjoining silicon single-crystal region 423, which are re-crystallized on the basis of irradiation of a laser beam with the above-mentioned light intensity distribution.

It is desirable that a channel 430 of the thin-film transistor 420 be formed only in the silicon single-crystal region 423. A source/drain region 431 that is doped with high-concentration impurities may partly include the silicon polycrystal region 424 that is doped with high-concentration impurities. In this case, it was found that no problem would arise with respect to conduction and connection to electrodes since the silicon polycrystal region 424 is doped with high-concentration impurities. FIG. 23A shows the example in which an electrode 428 is led out of only the silicon polycrystal region 424. However, the electrode 428 may be formed so as to extend over the polycrystal region 424 and single-crystal region 423.

Like an ordinary field-effect transistor, the thin-film transistor 420 is formed as a P-type transistor or an N-type transistor by properly choosing dopant impurities. A gate insulation film 425 of SiO$_2$, which has a thickness of, e.g. 30 nm, is formed on the silicon single-crystal region 423. A gate electrode 426, which is formed of, e.g. a MoV alloy film, and extends across the single-crystal region 423, is formed on the surface of the gate insulation film 425. The channel length is defined by the width of the gate electrode 426. An interlayer insulation film 427 that is formed of, e.g. SiO$_2$ is formed to cover the entire structure. Electrode wiring 429 that is formed of, e.g. a three-layer metal film of Mo/Al/Mo is provided via contact through-holes 428 that are made in the interlayer insulation film 427.

Figure 25:
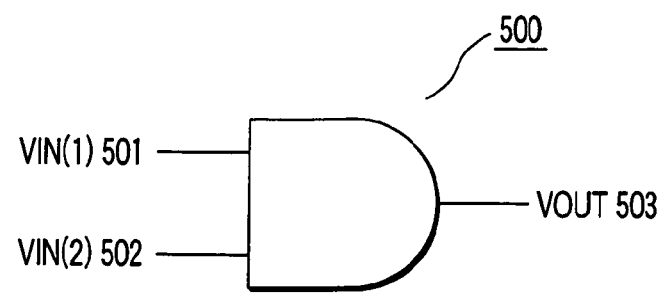
FIG. 25 is a logic diagram of the AND circuit cell according to the embodiments of the invention.
Figure 26:
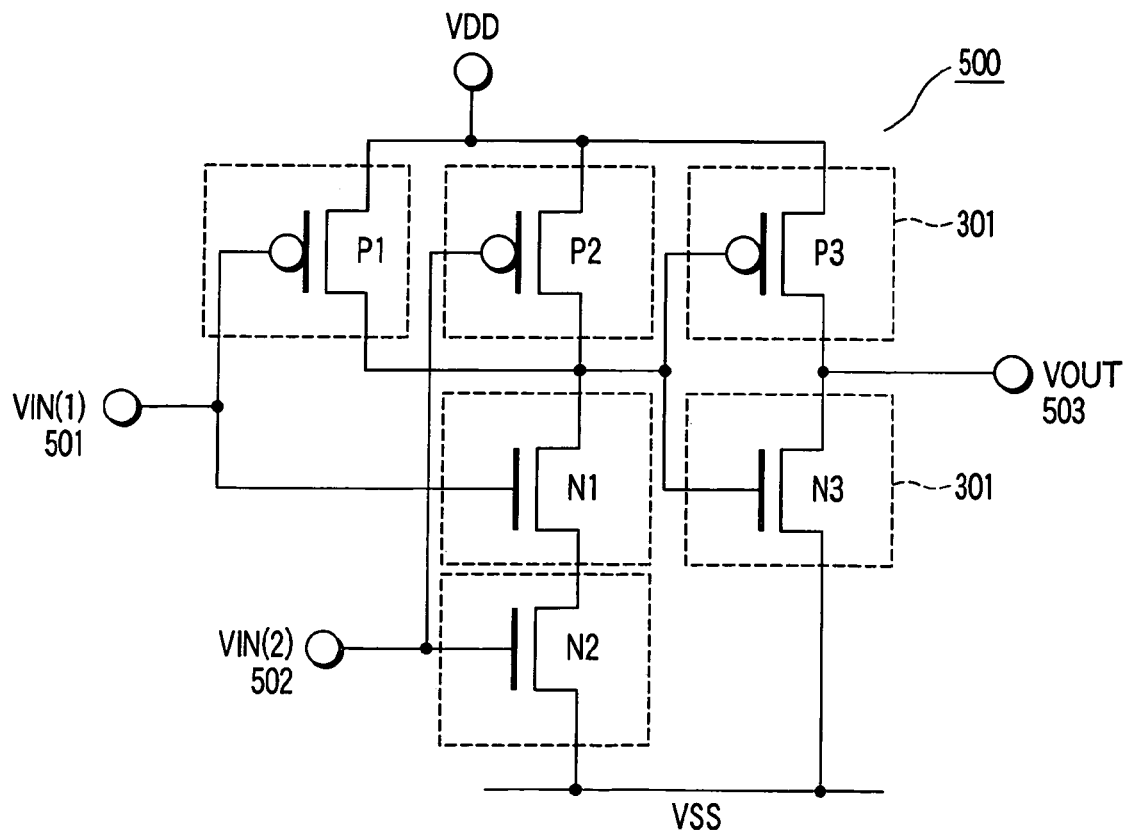
FIG. 26 is a circuit diagram of the AND circuit cell according to the embodiments of the invention.

FIG. 24 is a plan view of a CMOS AND circuit cell 500 that is formed on an array including single-crystal regions 301, which are arranged in a matrix with seven rows in the Y-direction, as in FIG. 20. FIG. 25 is a logic circuit diagram of the cell. FIG. 26 is a transistor-level circuit diagram. This cell produces a logical product between VIN(1) 501 and VIN(2) 502 and outputs it to VOUT 503.

This cell comprises six transistors P1 to P3 and N1 to N3. The channel length of each transistor is, e.g. 1 μm. The channel width of each of the transistors N1, N2, N3, P1 and P2 is, e.g. 2 μm, and the channel width of the transistor P3 is, e.g. 4 μm. Like the cell of FIG. 20, the channel region of each of the transistors is disposed at a substantially central part of the associated single-crystal region 301. In particular, as regards the transistor P3 with the large channel width, the semiconductor island is divided into two parts 504 and 505 in order to avoid grain boundaries. The parts 504 and 505 are disposed in different single-crystal regions 301. By connecting these parts in parallel, a large channel width is realized.

FIG. 27 is a plan view of a CMOS XOR circuit cell 600 that is formed on an array including single-crystal regions 301, which are arranged in a matrix with seven rows in the Y-direction, as in FIG. 20 or FIG. 24.

FIG. 28 is a transistor-level circuit diagram of the XOR circuit cell 600. This cell produces an exclusive logical sum of two inputs VIN(1) and VIN(2), and outputs it to VOUT 603. The XOR circuit cell 600 comprises eight transistors P1 to P4 and N1 to N4. The channel length of each transistor is, e.g. 1 μm. The channel width of each of the transistors N1 to N4 is, e.g. 2 μm, and the channel width of each of the transistors P1 to P4 is, e.g. 4 μm.

The channel regions of all transistors are disposed at substantially central parts of the associated single-crystal regions 301 at intervals of, e.g. 5 μm, which is equal to the pitch of the single-crystal regions 301. Like the AND cell 500 of FIG. 24, the P-type transistor with a channel width of, e.g. 4 μm is configured such that two transistor components each with a channel width of 2 μm are connected in parallel.

The logic cells shown in FIGS. 20, 24 and 27 are fabricated using some design layouts that are chosen from the cell libraries. Many other logic cells are registered in the actual cell libraries. These logic cells have the same plan-pattern characteristics as the above-described examples. In other words, the channels of transistors are arranged with cyclic intervals that correspond to the pitch of arrangement of single-crystal regions 301, and all cells are formed on the arrays of single-crystal regions with seven rows in the Y-direction. The number of columns in the X-direction may be varied depending on the scale of the cell.

Figure 29:
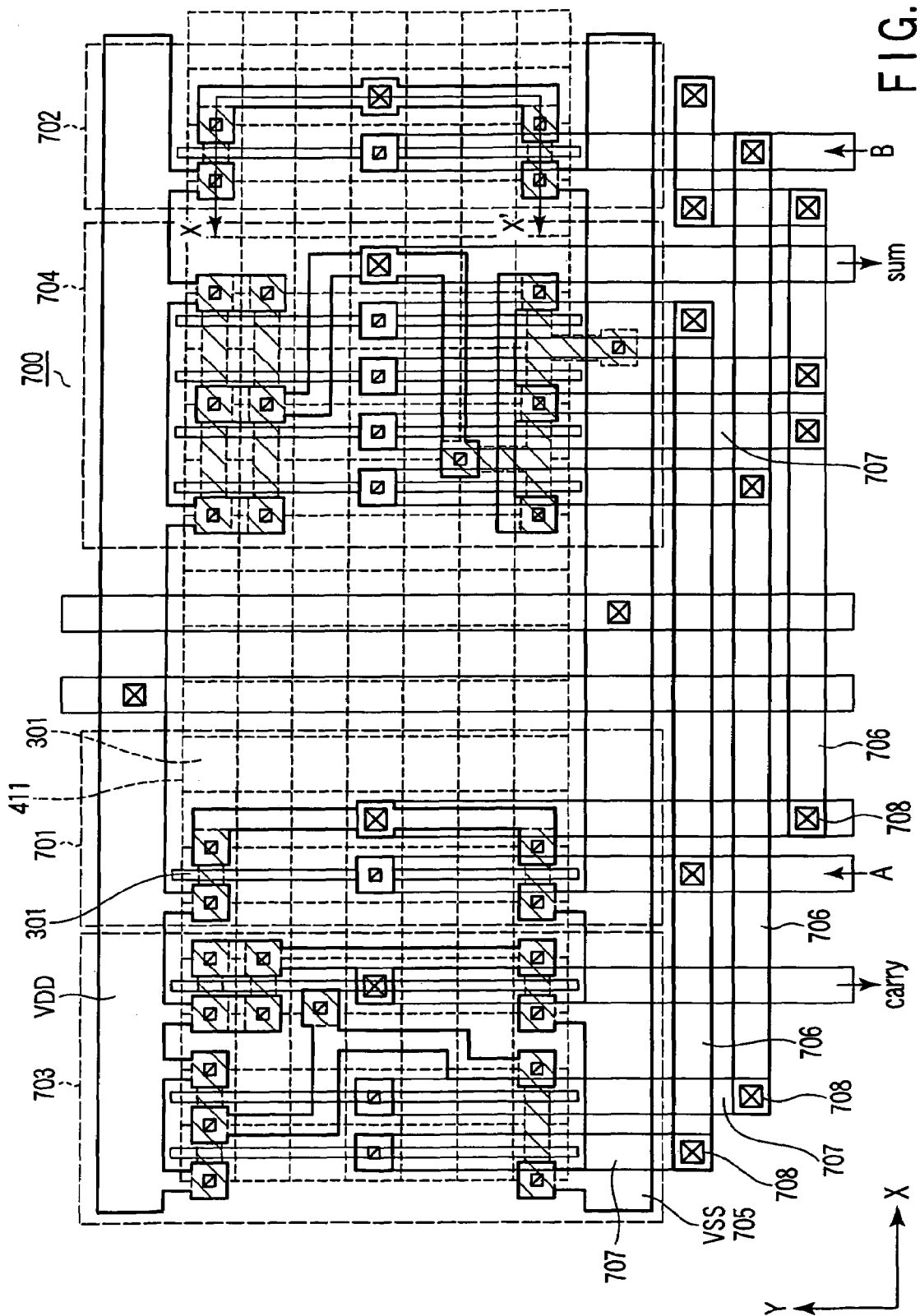
FIG. 29 is a plan view of a half adder circuit according to the embodiments of the invention.

FIG. 29 is a plan view of a half adder circuit 700 that is compounded by automatic disposition/wiring software using two inverter circuits 701 and 702, an AND circuit 703 and an XOR circuit 704. FIG. 30 is a logic circuit diagram of the half adder circuit 700.

The Y-directional dimensions of all logic cells are made uniform. Thus, by arranging the cells in the X-direction, power supply lines and ground lines can automatically be connected. The cells are connected by first-layer AL lines 706, which are arranged in parallel to the direction of extension of a ground line 705 outside the cell arrangement region, second-layer AL lines 707, which extend from input/output contacts of the respective cells in a direction perpendicular to the ground line 705, and through-holes CONT(2) 708 that connect the first-layer AL lines 706 and second-layer AL lines 707. The relative positions of the logic cells are determined so as to maintain the overall cyclic arrangement of the channels of the transistors. Thus, the compounded circuit, too, has the feature that the channels of the transistors are arranged at intervals corresponding to the pitch of arrangement of single-crystal regions 301.

The use of the logic cells according to the embodiment makes it possible to dispose the channels of the transistors only in the single-crystal regions 301 of the semiconductor thin-films in which the single-crystal regions 301 and grain boundaries 304 are present in a mixed fashion.

FIG. 31 is a cross-sectional view taken along line X-X' in FIG. 29. A buffer insulation film, which comprises an SiNx film 800 with a thickness of, e.g. 50 nm and an SiO$_2$ film 801 with a thickness of, e.g. 100 nm, is formed on, e.g. a no-alkali glass substrate 201. The substrate 201 is not limited to the glass substrate. Alternatively, a quartz substrate, for instance, may be used. The buffer insulation film, which comprises the SiNx film and the SiO$_2$ film, prevents diffusion of impurities from the glass substrate 201.

A silicon thin film 830 with a thickness of, e.g. 200 nm, which is re-crystallized by laser irradiation, is formed on the SiO$_2$ film 801. The silicon thin film 830, as shown in FIG. 23, is a silicon thin film that includes a central silicon single-crystal region and silicon polycrystal regions provided at both end portions of the central silicon single-crystal region. The silicon thin film 830 forms a transistor. A gate insulation film 820 of SiO$_2$, which has a thickness of, e.g. 30 nm, is formed on the SiO$_2$ film 801 and silicon thin film 830.

A gate electrode 840, which is formed of, e.g. a MoV alloy film, is formed on the surface of the gate insulation film 820. A first interlayer insulation film 821 that is formed of SiO$_2$ is formed to cover the entire structure. Power supply wiring VDD 850, ground wiring VSS 860 and connection wiring 815 for interconnect within the cell, which are formed of, e.g. three-layer metal films of Mo/Al/Mo, are provided via contact through-holes CONT(1) 841 that are made in the interlayer insulation film 821.

A second interlayer insulation film 822 of SiO$_2$ is formed so as to cover the entire structure. The connection wiring 815 is connected to inter-cell connection wiring 816, which is formed of Al, via a contact through-hole CONT(2) 842 that is made in the second interlayer insulation film 822. A protection insulation film 823 of SiNx is formed so as to cover the entire structure.

The display apparatus of the present invention is usable, for instance, as an image display device for a mobile information terminal or a mobile phone, or as an image display apparatus of an information apparatus such as a personal computer. This display apparatus is also applicable to other uses.

The principle of the present invention has been described referring to specific examples. The above description is merely exemplification and, as is obvious, does not limit the technical scope of the present invention.

What is claimed is:

1. An active matrix display apparatus formed by using thin-film transistors formed on an insulating substrate, comprising:

a circuit that receives an image data signal from an external system via a non-contact transmission path which includes an inductor comprising a winding made of a metal thin film provided on the insulating substrate, and that amplifies the image data signal; and a circuit that processes the amplified image data signal, wherein a channel region of at least one thin-film transistor including respective circuits is provided on a silicon thin film that is formed on the insulating substrate, the silicon thin film having crystal growth in a lateral direction whose area is larger than the channel region.

2. A display apparatus formed by using thin-film transistors formed on an insulating substrate, comprising:

a circuit that receives an image data signal from an external system via a non-contact transmission path, and amplifies the image data signal; and a circuit that processes the amplified image data signal, wherein the circuit that receives and amplifies the image data signal and the circuit that processes the amplified image data signal are integrated on the insulating substrate, and at least one of the respective circuits is formed by thin-film transistors including a channel region provided on a silicon thin film that is formed on the insulating substrate, the silicon thin film having crystal grown in a lateral direction whose area is larger than the channel region.

3. The display apparatus according to any one of claims 1 to 2, further comprising a memory circuit that is connected to the circuit that processes the image data signal, and stores the processed image data.

4. The display apparatus according to claim 3, wherein the memory circuit is a static random access memory.

5. The display apparatus according to any one of claims 1 to 2, wherein the non-contact transmission path is a capacitive-coupling transmission line that is composed of two pairs of closely opposed planar electrodes.

6. The display apparatus according to any one of claims 1 to 2, wherein the non-contact transmission path is an inductive-coupling transmission line that is composed of a pair of inductors.

7. The display apparatus according to claim 6, wherein a transmission inductor element and a reception inductor element, which are included in the paired inductors, have winding portions of different sizes.

8. The display apparatus according to any one of claims 1 to 2, wherein the image data signal is compressed data signal.

9. The display apparatus according to any one of claims 1 to 2, wherein the circuit that processes the image data signal includes a compressed data decompression circuit.

10. The display apparatus according to any one of claims 1 to 2, wherein the insulating substrate is a glass substrate.

11. The display apparatus according to any one of claims 1 to 2, wherein the insulating substrate further includes an antenna and a transmission circuit, and reception and transmission are switched by a switch that uses a thin-film transistor, thereby enabling signal transmission.

12. The display apparatus according to any one of claims 1 to 2, wherein in that the non-contact transmission path is an optical transmission line.

13. The display apparatus according to any one of claims 1 to 2, wherein the insulating substrate includes a connection end portion that is to be inserted in a connection slot that is formed in the external system, and the insulating substrate, when used, is coupled to the connection slot.

14. The display apparatus according to any one of claims 1 to 2, wherein the display apparatus uses one of liquid crystal and an organic electroluminescent element as a pixel.

* * * * *